United States Patent
Yoon et al.

(10) Patent No.: US 11,742,401 B2
(45) Date of Patent: Aug. 29, 2023

(54) SEMICONDUCTOR DEVICES HAVING AN INSULATION LAYER IN A RECESS AND AN IMPURITY BARRIER LAYER EXTENDING ALONG THE INSULATION LAYER

(71) Applicant: Samsung Electronics Co., Ltd., Suwon-si (KR)

(72) Inventors: Sungmi Yoon, Seoul (KR); Jooyub Kim, Seoul (KR); Daehyun Kim, Suwon-si (KR); Juhyung We, Hwaseong-si (KR); Donghyun Im, Yongin-si (KR); Chunhyung Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/340,667

(22) Filed: Jun. 7, 2021

(65) Prior Publication Data

US 2022/0181457 A1    Jun. 9, 2022

(30) Foreign Application Priority Data

Dec. 7, 2020    (KR) ........................ 10-2020-0169706

(51) Int. Cl.
*H01L 29/423* (2006.01)
*H01L 29/49* (2006.01)
*H10B 12/00* (2023.01)

(52) U.S. Cl.
CPC .......... *H01L 29/4236* (2013.01); *H01L 29/49* (2013.01); *H10B 12/053* (2023.02);
(Continued)

(58) Field of Classification Search
CPC ........... H01L 29/4236; H01L 27/10823; H01L 27/10876; H01L 29/4916; H01L 29/4925;
(Continued)

(56) References Cited

U.S. PATENT DOCUMENTS 9,064,956 B2    6/2015  Oh et al.
9,356,029 B2    5/2016  Oh et al.
(Continued)

FOREIGN PATENT DOCUMENTS

KR    10-2004-0012072 A    2/2004
KR    10-1987995 B1    3/2014

*Primary Examiner* — Nicholas J Tobergte
*Assistant Examiner* — William Henry Anderson
(74) *Attorney, Agent, or Firm* — Harness, Dickey & Pierce, P.L.C.

(57) ABSTRACT

A semiconductor device may include a substrate including a recess, a gate insulation layer on a surface of the recess, an impurity barrier layer on a surface of the gate insulation layer to cover the surface of the gate insulation layer, a first gate pattern on impurity barrier layer to fill a lower portion of the recess, a second gate pattern on the first gate pattern in the recess, a capping insulation pattern on the second gate pattern to fill the recess, and impurity regions at the substrate adjacent to an upper sidewall of the recess. The impurity barrier layer may have a concentration of nitrogen higher than a concentration of nitrogen included in the gate insulation layer. The second gate pattern may include a material different from a material of the first gate pattern. A lower surface of the impurity regions may be higher than an upper surface of the first gate pattern. Thus, the semiconductor device may have good characteristics.

20 Claims, 19 Drawing Sheets

(52) U.S. Cl.
CPC .......... *H10B 12/34* (2023.02); *H10B 12/488* (2023.02); *H10B 12/30* (2023.02); *H10B 12/315* (2023.02)

(58) Field of Classification Search
CPC .............. H01L 29/4941; H01L 29/495; H01L 29/4958; H01L 29/4966; H01L 21/76822; H01L 21/76825–76832
See application file for complete search history.

(56) References Cited

U.S. PATENT DOCUMENTS

| | | |
|---|---|---|
| 10,373,959 B2 | 8/2019 | Im et al. |
| 10,700,070 B2 | 6/2020 | Ting et al. |
| 10,741,643 B2 * | 8/2020 | Ryu .................. H01L 29/66621 |
| 11,239,118 B2 * | 2/2022 | Kim .................. H01L 29/66621 |
| 2016/0093710 A1 | 3/2016 | Jeong |
| 2016/0172488 A1 * | 6/2016 | Oh ......................... H10B 63/30 257/330 |
| 2016/0240538 A1 | 8/2016 | Oh et al. |
| 2017/0125422 A1 * | 5/2017 | Kang ................ H01L 21/28105 |
| 2017/0365608 A1 * | 12/2017 | Lee ....................... H01L 29/517 |
| 2020/0152754 A1 | 5/2020 | Kim et al. |
| 2020/0395455 A1 * | 12/2020 | Kim .................. H01L 29/66621 |

* cited by examiner

SEMICONDUCTOR DEVICES HAVING AN INSULATION LAYER IN A RECESS AND AN IMPURITY BARRIER LAYER EXTENDING ALONG THE INSULATION LAYER

CROSS-REFERENCE TO RELATED APPLICATION

This application claims priority under 35 USC § 119 to Korean Patent Application No. 10-2020-0169706, filed on Dec. 7, 2020, in the Korean Intellectual Property Office (KIPO), the contents of which are incorporated by reference herein in their entirety.

BACKGROUND

Some example embodiments relate to a semiconductor device. More particularly, example embodiments relate to a semiconductor device including buried channel array transistors and/or a method of forming the semiconductor device including buried channel array transistors.

In a case of a buried channel array transistor, a gate structure may be formed to be buried in a recess of a substrate. Electrical characteristics of the buried channel array transistor may be changed by/affected impurities included in a gate insulation layer of the gate structure. The impurities included in the gate insulation layer may diffuse into other regions of the gate structure. Alternatively or additionally, in the buried channel array transistor, leakage currents may occur at a portion where electric fields are concentrated. Thus, manufacturing/fabrication of buried channel array transistors having improved/excellent electrical characteristics may be difficult.

SUMMARY

Some example embodiments provide a semiconductor device having good electrical characteristics.

Alternatively or additionally, some example embodiments provide methods of manufacturing/fabricating a semiconductor device having good electrical characteristics.

According to some example embodiments, there is provided a semiconductor device that may include a substrate having a recess, a gate insulation layer on a surface of the recess, an impurity barrier layer on a surface of the gate insulation layer, the impurity barrier layer covering the surface of the gate insulation layer, the impurity barrier layer having a concentration of nitrogen greater than a concentration of nitrogen included in the gate insulation layer, a first gate pattern on the impurity barrier layer, the first gate pattern filling a lower portion of the recess, a second gate pattern on the first gate pattern and in the recess, the second gate pattern including a material different from materials included in the first gate pattern, a capping insulation pattern on the second gate pattern, the capping insulation pattern filing, and impurity regions at the substrate adjacent to an upper sidewall of the recess, lower surfaces of the impurity regions being higher than an upper surface of the first gate pattern.

According to some example embodiments, there is provided a semiconductor device that may include a substrate having a recess, a gate insulation layer on a surface of the recess, a first impurity barrier layer covering a surface of the gate insulation layer at a lower portion of the recess, the first impurity barrier layer having a concentration of nitrogen greater than a concentration of nitrogen included in the gate insulation layer, a second impurity barrier layer covering a surface of the gate insulation layer at an upper portion of the recess, the second impurity barrier layer having a concentration of nitrogen greater than a concentration of nitrogen included in the first impurity barrier layer, a first gate pattern on the gate insulation layer and filling a lower portion of the recess, the first gate pattern including a metal, a second gate pattern on the first gate pattern and in the recess, the second gate pattern including doped polysilicon, a capping insulation pattern filling the recess, and impurity regions at the substrate adjacent to an upper sidewall of the recess, lower surfaces of the impurity regions being higher than an upper surface of the first gate pattern.

According to some example embodiments, there is provided a semiconductor device that may include a substrate including an isolation region and an active region, the substrate defining a recess extending a first direction, a gate insulation layer on a surface of the recess, an impurity barrier layer on a surface of the gate insulation layer, the impurity barrier layer covering the surface of the gate insulation layer, the impurity barrier layer having a concentration of nitrogen greater than a concentration of nitrogen of the gate insulation layer, a first gate pattern on the impurity barrier layer filling a lower portion of the recess, a second gate pattern on the first gate pattern in the recess and the second gate pattern including a material having a work function different from a work function of the first gate pattern, a capping insulation pattern on the second gate pattern, the capping insulation pattern filling the recess, and first and second impurity regions at the substrate adjacent to an upper sidewall of the recess, lower surfaces of the first and second impurity regions being higher than an upper surface of the first gate pattern, a bit line structure electrically connected to the first impurity region, and a capacitor electrically connected to the second impurity region.

According to some example embodiments, there is provided a method of manufacturing a semiconductor device. The method includes partially etching an upper portion of a substrate to form a recess, forming a gate insulation layer on a surface of the recess, injecting nitrogen onto a surface of the gate insulation layer to form an impurity barrier layer on the surface of the gate insulation layer, wherein the impurity barrier layer has a concentration of the nitrogen greater than a concentration of the nitrogen included in the gate insulation layer, forming a first gate pattern on the impurity barrier layer to fill a lower portion of the recess, forming a second gate pattern on the first gate pattern in the recess, the second gate pattern including a material having a work function different from a work function of the first gate pattern, forming a capping insulation pattern on the second gate pattern to fill the recess, and forming impurity regions at the substrate adjacent to an upper sidewall of the recess, each of the impurity regions having a lower surface higher than an upper surface of the first gate pattern.

In some example embodiments of the semiconductor device, the gate structure in a transistor may include the impurity barrier layer on the surface of the gate insulation layer. Therefore, impurities such as reactive gases and/or reactants included in the gate insulation layer may be decreased. Also, the impurities may be decreased in probability of diffusion into source/drain regions and/or channel regions of the transistor. Accordingly, the transistor may have improved/excellent electrical characteristics.

BRIEF DESCRIPTION OF THE DRAWINGS

Some example embodiments will be more clearly understood from the following detailed description taken in conjunction with the accompanying drawings.

FIG. 1 is a cross-sectional view illustrating a transistor in accordance with some example embodiments;

FIG. 2 is a cross-sectional view illustrating a transistor in accordance with some example embodiments;

FIGS. 3 to 11 are cross-sectional views illustrating a method of manufacturing a transistor in accordance with some example embodiments;

FIG. 12 is a cross-sectional view illustrating a transistor in accordance with some example embodiments;

FIGS. 13 and 14 are cross-sectional views illustrating a method of manufacturing a transistor in accordance with some example embodiments;

FIG. 15 is a cross-sectional view illustrating a transistor in accordance with some example embodiments;

FIG. 16 is a cross-sectional view illustrating a transistor in accordance with some example embodiments;

FIG. 17 is a cross-sectional view illustrating a semiconductor device in accordance with some example embodiments;

FIG. 18 is a layout diagram of a semiconductor device in accordance with some example embodiments;

FIG. 19 is a perspective view of a semiconductor device in accordance with some example embodiments;

FIG. 20 is a cross-sectional view taken along a line X1-X1' and a line Y1-Y1' of FIG. 18;

FIG. 21 is a layout diagram illustrating a semiconductor device in accordance with some example embodiments; and FIG. 22 is a perspective view illustrating a semiconductor device in accordance with some example embodiments.

DETAILED DESCRIPTION OF SOME EXAMPLE EMBODIMENTS

Figure 1:
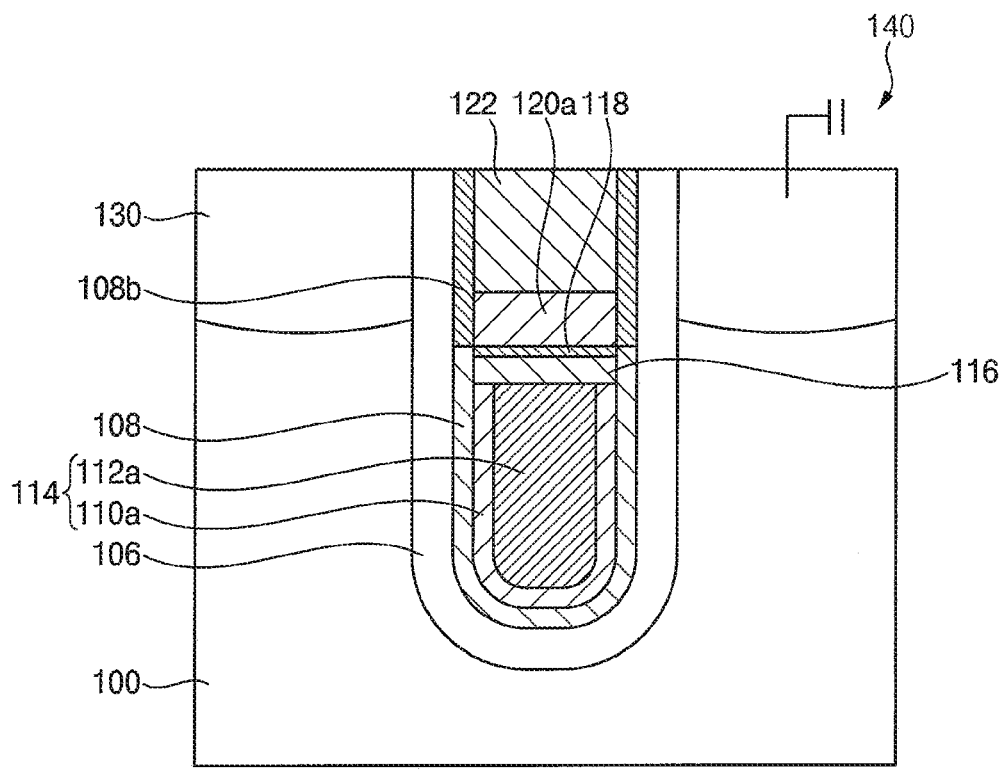
FIGS. 1 to 22 represent non-limiting, example embodiments as described herein.

FIG. 1 is a cross-sectional view illustrating a transistor in accordance with some example embodiments.

The transistor shown in FIG. 1 may be a buried channel array transistor.

Referring to FIG. 1, a substrate 100 may include a semiconductor material such as a single-crystal semiconductor material that may or may not be doped with impurities such as boron. The semiconductor material may include at least one of silicon, germanium, or silicon-germanium, or a group III-V compound semiconductor such as GaP, GaAs, or GaSb. In some example embodiments, the substrate 100 may be a silicon-on-insulator (SOI) substrate or a germanium-on-insulator (GOI) substrate. For example, the substrate 100 may include silicon, e.g. lightly doped single crystal silicon.

An upper portion of the substrate may include/define a recess 104 (refer to FIG. 3) for forming a gate. In some example embodiments, the recess 104 may extend in a first direction that is a horizontal direction to a surface of the substrate 100.

A gate insulation layer 106 may be formed, e.g. conformally formed, on sidewalls and a bottom of the recess 104. The gate insulation layer 106 may be formed with a thermal oxidation process such as an in-situ steam generation (ISSG) process, and/or with a chemical vapor deposition (CVD) process.

In some example embodiments, the gate insulation layer 106 may include silicon oxide. In some example embodiments, the gate insulation layer 106 may include metal oxide. The metal oxide may include, e.g., at least one of hafnium oxide, zirconium oxide, titanium oxide, or the like.

An impurity barrier layer may be formed on a surface of the gate insulation layer 106 to cover the surface of the gate insulation layer. The impurity barrier layer may include a first impurity barrier layer 108 and a second impurity barrier layer 108b on at least a portion of the first impurity barrier layer 108. In some example embodiments, the first impurity barrier layer 108 may cover the gate insulation layer 106 positioned lower than an upper surface of a barrier interface layer pattern 116, to be described in more detail below. The second impurity barrier layer 108b may cover the gate insulation layer 106 positioned higher than the upper surface of the barrier interface layer pattern 116. However, a position of the first and second impurity barrier layers 108 and 108b may not be limited thereto. The second impurity barrier layer 108b may at least cover the gate insulation layer 106 positioned higher than a bottom of a second gate pattern 120a to be described in more detail below. For example, the second impurity barrier layer 108b may cover the gate insulation layer 106 positioned higher than an upper surface of an upper barrier interface layer pattern 118.

The first and second impurity barrier layers 108 and 108b may be formed by injecting, e.g. implanting and/or incorporating, nitrogen into a material of, e.g. a same material as, the gate insulation layer 106. Thus, each of the first and second impurity barrier layers 108 and 108b may be a material layer including the material of the gate insulation layer 106, e.g. a material that does not include nitrogen, and may further include additional nitrogen. For example, the first and second impurity barrier layers 108 and 108b may include a silicon oxide containing the nitrogen and/or a metal oxide containing the nitrogen. A concentration of the nitrogen included in the first and second impurity barrier layers 108 and 108b may be higher than a concentration of the nitrogen included in the gate insulation layer 106 under the first and second impurity barrier layers 108 and 108b.

For example a concentration of nitrogen included in the gate insulation layer 106 may be 0 atm %, or close to 0 atm %, while a concentration of nitrogen included in the first and second impurity barrier layers 108 and 108b may be larger, e.g. may be larger by orders of magnitude than the concentration of nitrogen included in the gate insulation layer 106. The concentration of nitrogen may be determined by, e.g. measured on the basis of, an analytical technique such as but not limited to at least one of a secondary ion mass spectrometry (SIMS) process and/or a transmission electron microscopy (TEM) and/or a scanning electron microscope (SEM) process.

The concentration of the nitrogen included in the second impurity barrier layer 108b may be higher than/greater than the concentration of the nitrogen included in the first impurity barrier layer 108. Hereinafter, the gate insulation layer 106 contacting the second impurity barrier layer 108b may be referred to as an upper gate insulation layer, and the gate insulation layer 106 contacting the first impurity barrier layer 108 may be referred to as a lower gate insulation layer. A concentration of the nitrogen included in the upper gate insulation layer may be higher than/greater than a concentration of the nitrogen included in the lower gate insulation layer.

A first gate pattern 114 filling a lower portion of the recess 104 may be formed on the first impurity barrier layer 108. The first gate pattern 114 may include a metal such as at least one of tungsten (W), aluminum (Al), or copper (Cu). In some example embodiments, the first gate pattern 114 may include a barrier metal pattern 110a and a metal pattern 112a.

The barrier metal pattern 110a may be conformally formed on an upper surface of the first impurity barrier layer 108, and the metal pattern 112a may be formed on the barrier metal pattern 110a to fill the lower portion of the recess. Thus, the barrier metal pattern 110a may surround sidewalls and a bottom of the metal pattern 112a.

In some example embodiments, the metal pattern 112a may have a first work function, and the first work function may be higher than a work function of a semiconductor material included in the substrate 100. For example, the first work function may be greater than a work function of silicon.

In some example embodiments, the barrier metal pattern 110a may include at least one of titanium, titanium nitride, tantalum, tantalum nitride, tungsten nitride, tungsten carbon nitride, or the like. In some example embodiments, the metal pattern 112a may include at least one of tungsten, aluminum, copper, or the like. For example, the metal pattern 112a may include tungsten, and in this case, the first work function may be about 4.58 eV.

The first gate pattern 114 may have a first height from a bottom (i.e., a lowermost surface) to an upper surface of the first gate pattern 114. The first gate pattern 114 may include the metal, and thus the first gate pattern 114 may have relatively low resistance.

A barrier interface layer pattern 116 may be formed on the upper surface of the first gate pattern 114. The barrier interface layer pattern 116 may include nitride and/or oxynitride of materials of the metal pattern 112a and the barrier metal pattern 110a. In some example embodiments, the barrier interface layer pattern 116 may include metal nitride and/or metal oxynitride formed by nitridation of upper surfaces of the metal pattern 112a and the barrier metal pattern 110a. For example, the barrier interface layer pattern 116 may include at least one of tungsten nitride (WNx) and tungsten oxynitride (WxOyNz).

As the barrier interface layer pattern 116 is formed, a reaction and/or a mixing and/or a diffusion between the first gate pattern 114 and a second gate pattern 120a may be decreased, e.g. decreased in likelihood of occurrence during thermal processes used in the fabrication of the semiconductor device.

An upper barrier interface layer pattern 118 may be formed on the barrier interface layer pattern 116. The upper barrier interface layer pattern 118 may include a material of the barrier interface layer pattern 116, and may further include additionally nitrogen. A concentration of the nitrogen included in the upper barrier interface layer pattern 118 may be higher/greater than a concentration of the nitrogen included in the barrier interface layer pattern 116, e.g. greater by several orders of magnitude.

The second gate pattern 120a may be formed on the upper barrier interface layer pattern 118. The second gate pattern 120a may include a material different from a material of the first gate pattern 114, and may not include any materials included in the first gate pattern 114.

In some example embodiments, the second gate pattern 120a may have a second work function different from the first work function. The second work function may be lower than/less than the first work function.

The second gate pattern 120a may be formed so as to reduce gate induced drain leakages (GIDL) of the transistor. For example, the second work function may be similar to the work function of an impurity region 130 serving as a source/drain. For example, a difference between the work function of the second gate pattern 120a and the work function of the impurity region 130 may be less than a difference between the work function of the first gate pattern 114 and the work function of the impurity region 130.

In some example embodiments, the second gate pattern 120a may include a semiconductor material doped with N-type impurities such as at least one of arsenic or phosphorus, or P-type impurities such as boron. For example, the second gate pattern 120a may include polysilicon doped with impurities such as at least one of boron, arsenic, or phosphorus. The impurities doped in the second gate pattern 120a may have a conductivity type the same as a conductivity type of the impurity region 130 or the primary conductivity type of the impurity region 130.

However, example embodiments are not limited thereto. For example, impurities included in any of the second gate pattern 120a and/or the impurity region 130 may include carbon and/or germanium. Alternatively or additionally, there may be a pocket and/or a halo region included in the impurity region 130 containing impurities of an opposite conductivity type and at a lower concentration than other impurities included in the impurity region 130.

In some example embodiments, the second gate pattern 120a may have a second height from a bottom to an upper surface of the second gate pattern 120a, and the second height may be less than the first height. The first height of the first gate pattern 114 having low resistance may be greater than the second height of the second gate pattern 120a, so that a total resistance of the gate in the transistor may be decreased.

A capping insulation pattern 122 may be formed on the second gate pattern 120a. The capping insulation pattern 122 may completely fill a remaining portion of the recess 104 over the second gate pattern 120a. The capping insulation pattern 122 may include, e.g., silicon nitride.

In some example embodiments, the capping insulation pattern 122 may have a third height from a bottom to an upper surface of the capping insulation pattern 122, and the third height may be higher than the second height.

As described above, a gate structure including the gate insulation layer 106, the first impurity barrier layer 108, the second impurity barrier layer 108b, the first gate pattern 114, the second gate pattern 120a, the barrier interface layer pattern 116, the upper barrier interface layer pattern 118 and the capping insulation pattern 122 may be formed in/within the recess.

The impurity regions 130 serving as source/drain regions may be formed at an upper portion of the substrate 100 adjacent to both sidewalls of the gate structure. The impurity regions 130 may be positioned at the substrate 100 adjacent to an upper sidewall of the recess 104. The impurity regions 130 may have a concave profile in cross-section; however, example embodiments are not limited thereto.

In some example embodiments, a bottom of the impurity region 130 may be higher than the upper surface of the first gate pattern 114. For example, a junction of the impurity region 130 may be higher than an upper surface of the first gate pattern 114. In some example embodiments, the bottom of the impurity region 130 may be adjacent to a sidewall of the second gate pattern 120a. For example, the bottom of the impurity region 130 may be disposed to face at least the sidewall of the second gate pattern 120a.

In this case, a difference between the work function of the impurity region 130 and the work function of the second gate pattern 120a may be less than a difference between the work function of the impurity region 130 and the work function of the first gate pattern 114. Therefore, a potential difference between the impurity region 130 and the second gate pattern 120a adjacent to each other may be decreased, so that the GIDL generated at a portion of the substrate 100 between the impurity region 130 and the second gate pattern 120a may be decreased, and electrical performance may be improved.

As described above, the first impurity barrier layer 108 may be formed on the lower gate insulation layer positioned on a lower sidewall and a bottom of the recess 104, and the first impurity barrier layer 108 may contact the first gate pattern 114 and the barrier interface layer pattern 116.

The first impurity barrier layer 108 may prevent, or reduce the likelihood of, impurities including reactive gases and/or reactants from diffusing and/or penetrating into the lower gate insulation layer disposed under the first impurity barrier layer 108, e.g. during subsequent manufacturing processes of the transistor, e.g. subsequent thermal processes used during the fabrication of the transistor. As the first impurity barrier layer 108 is formed, a concentration of impurities such as Cl, F, and/or N included in the lower gate insulation layer may be decreased. A variation of a threshold voltage of the transistor due to such impurities included in the lower gate insulation layer may be decreased, and control of the threshold voltage of the transistor may be improved. Alternatively or additionally, a failure of reliability of the transistor due to the impurities included in the lower gate insulation layer may be decreased.

The impurities such as Cl, F, and/or N included in the lower gate insulation layer may be incidental and may not be associated with the formation of the lower gate insulating layer. For example, the impurities such as Cl, F, and/or N may be associated with polymers used during an etching process such as a dry etching process. However, example embodiments are not limited thereto. For example some of the impurities may be associated with a further layer such as a further doped polysilicon layer.

The second impurity barrier layer 108b may be formed on the upper gate insulation layer positioned on an upper sidewall of the recess 104, and the second impurity barrier layer 108b may contact the second gate pattern 120a and the capping insulation pattern 122. The concentration of the nitrogen included in the second impurity barrier layer 108b may be higher than/greater than the concentration of the nitrogen included in the first impurity barrier layer 108. Additionally or alternatively, the concentration of the nitrogen included in the upper gate insulation layer contacting the second impurity barrier layer 108b may be higher than/greater than the concentration of the nitrogen included in the lower gate insulation layer. Nitrogen included in the second impurity barrier layer 108b and the upper gate insulation layer may serve as a fixed positive charge.

In the transistor, a portion of the substrate 100 adjacent to the second gate pattern 120a may be or correspond to a portion where a strong electric field is generated (hereinafter, referred to as an electric field portion). Thus, the GIDL may frequently occur at the electric field portion. However, as the second impurity barrier layer 108b and the upper gate insulation layer contacting the second gate pattern 120a and the capping insulation pattern 122 include the fixed positive charge, the electric field at the electric field portion may be decreased by the fixed positive charge. Therefore, the GIDL may be decreased at the electric field region, and electrical performance of the transistor may be improved.

In some example embodiments, circuits may be connected to the impurity regions 130 of the transistor. For example, when the transistor is served as a selection device/access device of a memory cell in a DRAM device, a capacitor 140 may be connected to one of the impurity regions 130 of the transistor. A bit line (not shown) may be connected to the other one of the impurity regions 130 of the transistor.

Figure 2:
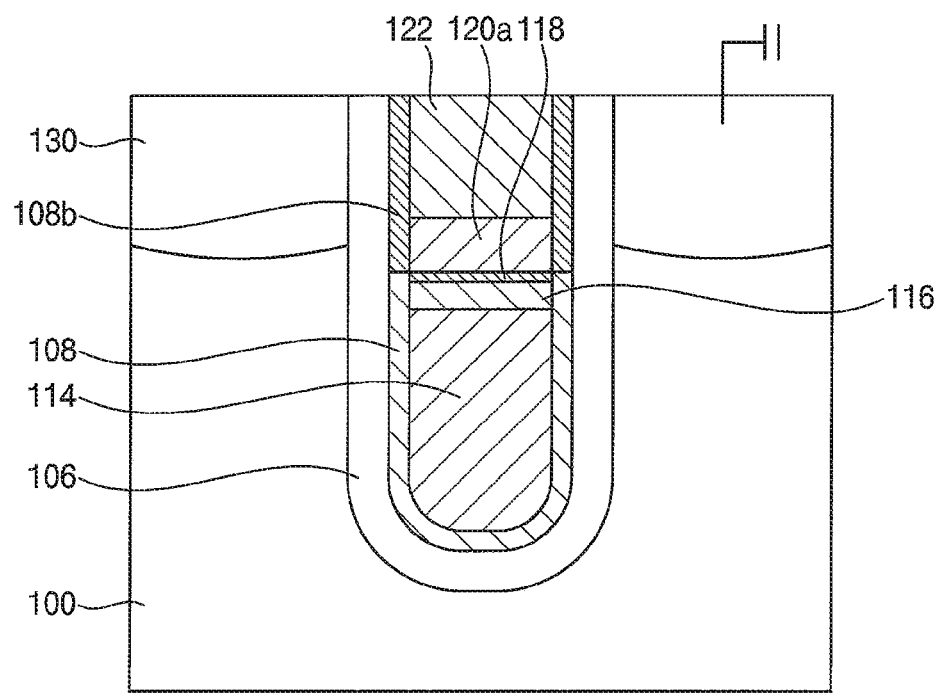

FIG. 2 is a cross-sectional view illustrating a transistor in accordance with some example embodiments.

The transistor shown in FIG. 2 is the same as the transistor described with reference to FIG. 1, except for materials of the first gate pattern and the barrier interface layer pattern.

Referring to FIG. 2, the first gate pattern 114 may include only a metal pattern. In example embodiments, the metal pattern may include titanium, titanium nitride, tantalum, tantalum nitride, or the like.

A barrier interface layer pattern 116 may be formed on an upper surface of the first gate pattern 114. The barrier interface layer pattern 116 may include metal nitride and/or metal oxynitride formed by nitridation of the upper surface of the metal pattern. For example, the barrier interface layer pattern 116 may include, e.g., at least one of TiN, TiON, TaN, TaON, etc.

The upper barrier interface layer pattern 118 may be formed on the barrier interface layer pattern 116, and the upper barrier interface layer pattern 118 may include a material of the barrier interface layer pattern 116, and may further include nitrogen.

FIGS. 3 to 11 are cross-sectional views illustrating a method of manufacturing a transistor in accordance with some example embodiments.

Figure 3:
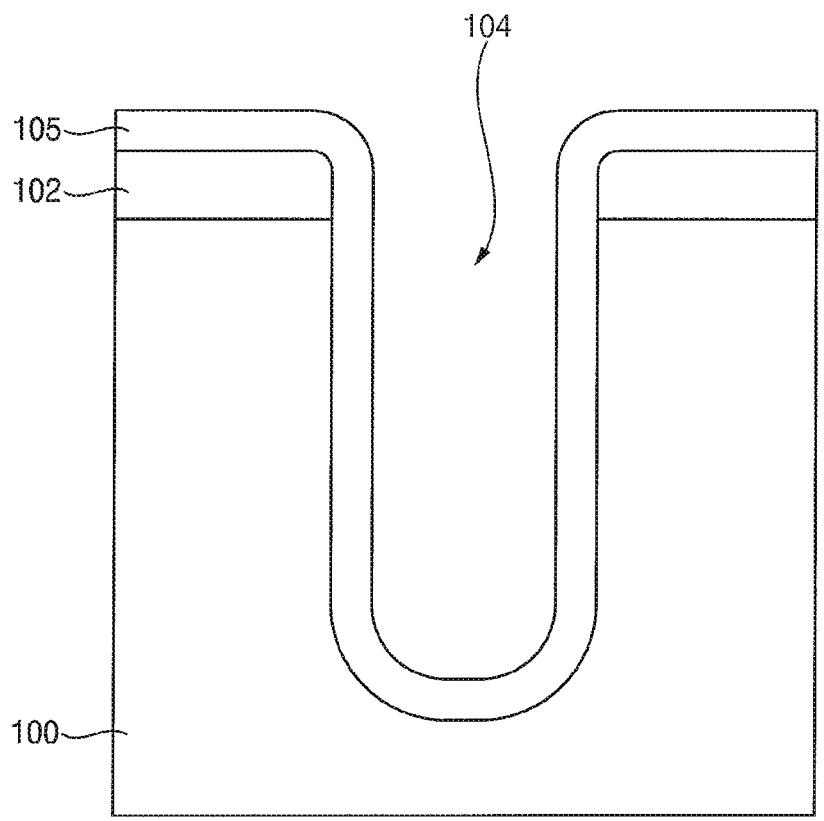

Referring to FIG. 3, a hard mask 102 may be formed on a substrate 100. Upper portion of the substrate 100 may be anisotropically etched, e.g. using a dry etching process, by using the hard mask 102 as an etching mask to form a recess 104.

A preliminary gate insulation layer 105 may be formed, e.g. conformally formed on a surface of the recess 104 and an upper surface of the hard mask 102.

In some example embodiments, the preliminary gate insulation layer 105 may include silicon oxide. The preliminary gate insulation layer 105 including the silicon oxide may be formed by a thermal oxidation process such as an in situ steam generation (ISSG) process, and/or an atomic layer deposition process. For example, the surface of the recess 104 may be thermally oxidized, e.g. portions of the substrate 100 may be consumed to grow and form a lower silicon oxide layer, and then an upper silicon oxide layer may be further formed on the lower silicon oxide layer by or the atomic layer deposition process. Thus, the preliminary gate insulation layer 105 including the lower and upper silicon oxide layers may be formed.

In some example embodiments, the preliminary gate insulation layer 105 may be or may include metal oxide. The metal oxide may be or include, e.g., at least one of hafnium oxide, zirconium oxide, titanium oxide, or the like. The metal oxide may be formed by the atomic layer deposition process. Before forming the metal oxide, a silicon oxide layer may be further formed on the surface of the recess 104 by thermally oxidizing the surface of the recess 104, e.g. by growing an oxide layer in the surface of the recess 104.

In some example embodiments, the preliminary gate insulation layer 105 may have a specific (or, alternatively, a predetermined) thickness in a direction perpendicular to the surface of the recess 104 and the surface of the hard mask 102.

Figure 4:
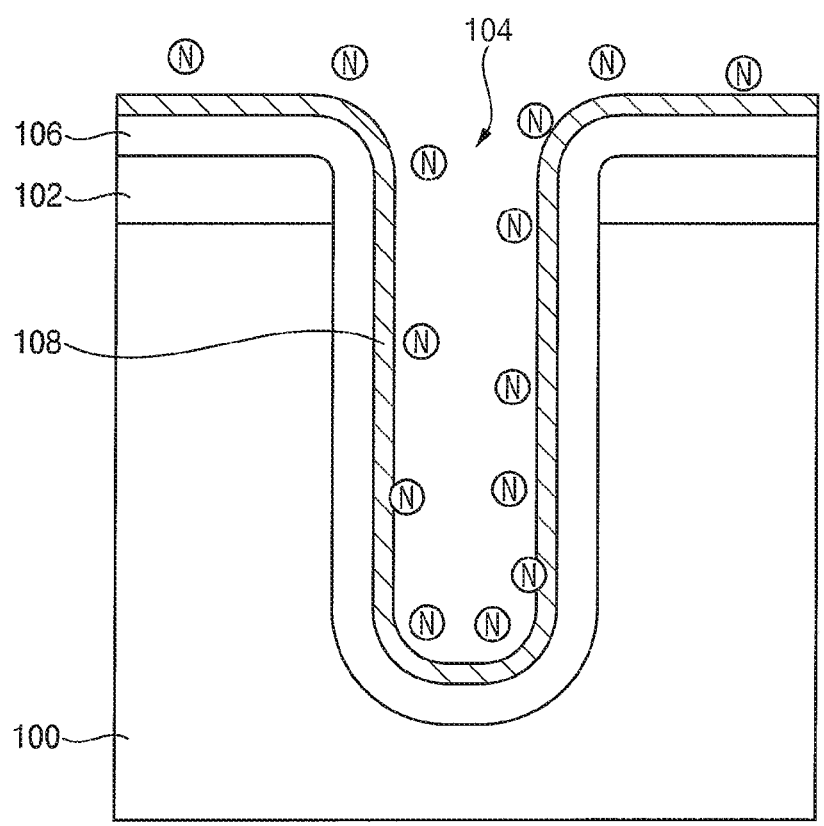

Referring to FIG. 4, nitrogen may be injected (e.g. doped) onto an upper surface of the preliminary gate insulation layer 105, so that the upper surface of the preliminary gate insulation layer 105 may be converted into a first impurity barrier layer 108. Therefore, a gate insulation layer 106 and the first impurity barrier layer 108 may be conformally formed on the surface of the recess 104 and the upper surface of the hard mask 102.

The nitrogen may be isotropically injected onto the surface of the preliminary gate insulation layer 105, so that the first impurity barrier layer 108 may be formed on an entire surface of the gate insulation layer 106.

The first impurity barrier layer 108 may include a material of the preliminary gate insulation layer 105 and further the nitrogen. For example, the first impurity barrier layer 108 may be a silicon oxide containing the nitrogen or a metal oxide containing the nitrogen.

The first impurity barrier layer 108 may prevent or reduce the likelihood of impurities including reactive gases and/or reactants from diffusing and/or penetrating into the gate insulation layer 106 under the first impurity barrier layer 108, in performing subsequent processes. A concentration of the nitrogen included in the first impurity barrier layer 108 may be higher than a concentration of the nitrogen included in the gate insulation layer 106 thereunder.

In some example embodiments, the process for injecting (or doping) the nitrogen may include a nitridation process using plasma (e.g., plasma nitridation process), a nitridation process using heat, and/or a heat treatment after/or before performing a plasma nitridation process. A nitrogen source gas used in the nitridation process may include $NH_3$, $NO_2$, $N_2O$, $N_2$, or the like. In the plasma nitridation process, the plasma may be generated by a process such as at least one of an RF plasma, microwave plasma, inductively coupled plasma (ICP), and remote plasma source (RPS).

In some example embodiments, the nitridation process using the plasma may be performed at 10° C. to 50° C. for 5 seconds to 200 seconds. In some example embodiments, when the heat treatment process is performed after performing the plasma nitridation process, the heat treatment process may be performed at 500° C. to 1200° C. for 1 second to 50 seconds. The nitridation process using only the heat may be performed at 100° C. to 1100° C. for 10 seconds to 200 seconds. However, each of the process condition is one of examples, and may not be limited thereto.

In some example embodiments, the nitridation may be performed with a decoupled nitride plasma (DPN) process. For example in some example embodiments, the DPN process may be performed to inject/embed nitride such as nitride plasma and/or ionized nitrogen to form the first impurity barrier layer 108. Subsequently there may be a thermal process such as a post-nitridation anneal (PNA) process performed. However, example embodiments are not limited thereto. For example, the nitridation may be performed with an anisotropic process. For example, alternatively to or in addition to a DPN process, nitrogen may be implanted, e.g. may be implanted with a beamline implant process, into the preliminary gate insulation layer 105.

Figure 5:
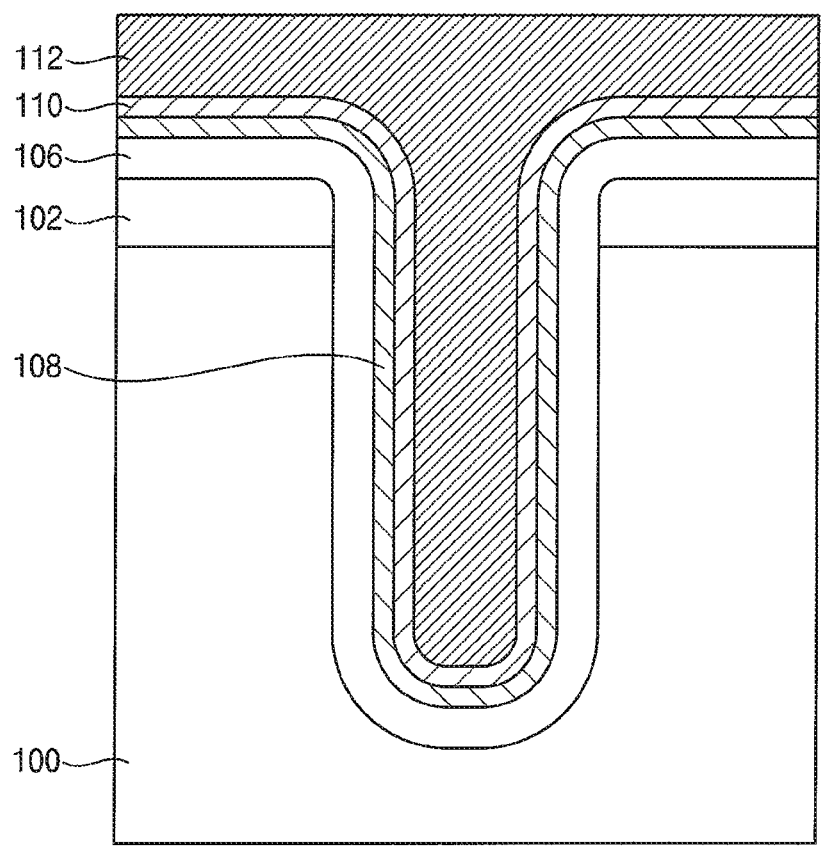

Referring to FIG. 5, a barrier metal layer 110 may be formed, e.g. may be conformally formed on the first impurity barrier layer 108. A metal layer 112 may be formed on the barrier metal layer 110 to fill a remaining portion of the recess 104.

In some example embodiments, the barrier metal layer 110 may include at least one of titanium, titanium nitride, tantalum, tantalum nitride, tungsten nitride, tungsten carbon nitride, or the like. The metal layer 112 may include, e.g., tungsten.

In some example embodiments, a metal layer may be formed on the first impurity barrier layer 108 to fill a remaining portion of the recess. The metal layer may include, e.g., at least one of titanium, titanium nitride, tantalum, tantalum nitride, etc. In this case, the transistor shown in FIG. 2 may be formed by a subsequent process. The metal layer may be formed with a deposition process such as at least one of a CVD process or a physical vapor deposition (PVD) process.

Figure 6:
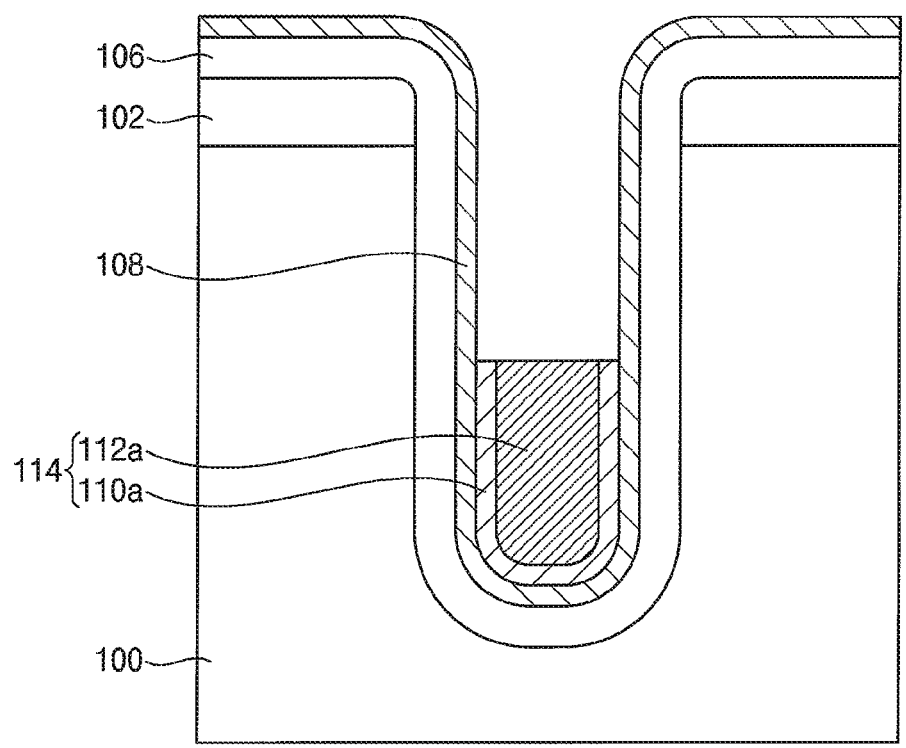

Referring to FIG. 6, the metal layer 112 and the barrier metal layer 110 may be planarized until the first impurity barrier layer 108 on the hard mask 102 may be exposed. The planarization process may include, e.g., a chemical mechanical polishing (CMP) process and/or with an etch back process. In some example embodiments, portions of the first impurity barrier layer 108 and the gate insulation layer 106 on the hard mask 102 may be removed, during the planarization process.

Thereafter, the metal layer 112 and the barrier metal layer 110 positioned in an upper portion of the recess 104 may be removed by an etch back process, e.g. with a blanket wet and/or dry etch process. Therefore, a barrier metal pattern 110a and a metal pattern 112a may be formed in a lower portion of the recess 104. The barrier metal pattern 110a and the metal pattern 112a may be formed on the first impurity barrier layer 108 positioned in the lower portion of the recess 104.

The barrier metal pattern 110a and the metal pattern 112a may serve as a first gate pattern 114 of the transistor.

Figure 7:
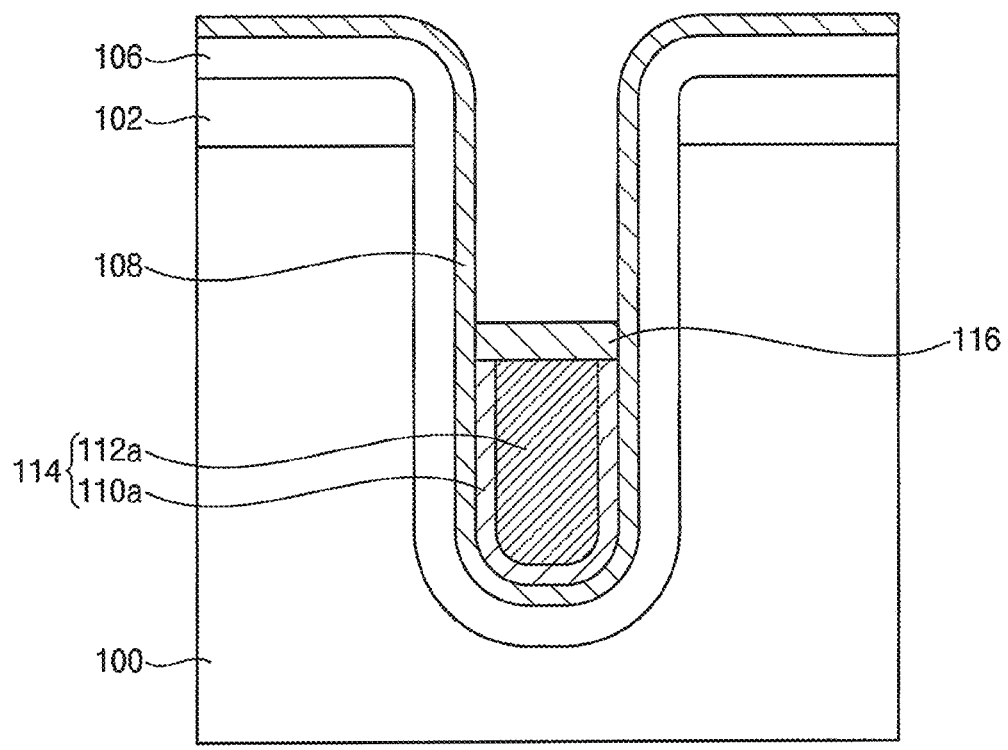

Referring to FIG. 7, an upper surface of the first gate pattern 114 may be nitrided by a nitridation treatment to form a barrier interface layer pattern 116 on the upper surface of the first gate pattern 114.

The nitridation treatment may include a rapid thermal nitridation (RTN) process. In some example embodiments, the rapid thermal nitridation process may be performed for 10 seconds to 100 seconds at a temperature of 700° C. to 1000° C.

In the nitridation treatment, the nitrogen may be isotropically and/or anisotropically injected (or doped or implanted) onto the first gate pattern 114, so that the barrier interface layer pattern 116 may be formed only on the upper surface of the first gate pattern 114. The barrier interface layer pattern 116 may include a metal nitride and/or metal oxynitride formed by nitridation of materials of the metal pattern 112a and the barrier metal pattern 110a.

In some example embodiments, when the metal pattern 112a includes tungsten, the barrier interface layer pattern 116 may include tungsten nitride ($WN_x$) and tungsten oxynitride ($W_xO_yN_z$).

In some example embodiments, when the first gate pattern 114 is formed of the metal pattern 112a including at least one of titanium, titanium nitride, tantalum, or tantalum nitride, the barrier interface layer pattern 116 may include, e.g., TiN, TION, TaN, or TaON. In this case, the transistor shown in FIG. 2 may be formed by subsequent processes.

When the barrier interface layer pattern 116 is formed, the first impurity barrier layer 108 positioned higher than a surface of the barrier interface layer pattern 116 may be exposed.

Figure 8:
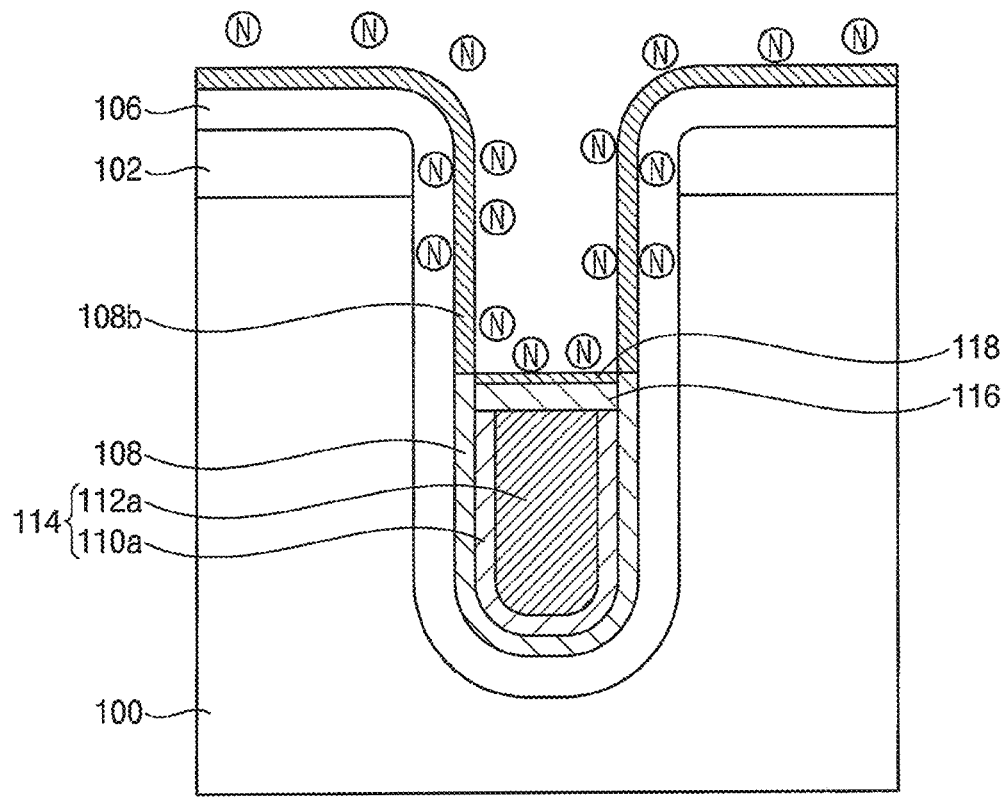

Referring to FIG. 8, nitrogen may be isotropically injected (or doped) onto the upper surface of the barrier interface layer pattern 116 and the exposed first impurity barrier layer 108. The nitrogen may be injected/doped with a process such as an RTN process; however, example embodiments are not limited thereto.

Thus, an upper barrier interface layer pattern 118 may be formed on the barrier interface layer pattern 116. The upper barrier interface layer pattern 118 may have a concentration of the nitrogen higher than a concentration of the nitrogen included in the barrier interface layer pattern 116. Further, the concentration of the nitrogen of the exposed first impurity barrier layer may increase, so that the exposed first impurity barrier layer may be converted into a second impurity barrier layer 108b.

In this case, the nitrogen may also be injected (or doped) onto the gate insulation layer 106 contacting the second impurity barrier layer 108b, so that the concentration of the nitrogen included in the gate insulation layer 106 positioned higher than the upper surface of the barrier interface layer pattern 116 may be increased. However, the nitrogen may not be injected into the gate insulation layer 106 and the first impurity barrier layer 108 positioned lower than the upper surface of the barrier interface layer pattern 116, so that the concentration of the nitrogen included in the gate insulation layer 106 and the first impurity barrier layer 108 positioned lower than the upper surface of the barrier interface layer pattern 116 may not be substantially increased.

Therefore, the first impurity barrier layer 108 may be formed in a portion of the recess 104 positioned lower than the upper surface of the barrier interface layer pattern 116. The second impurity barrier layer 108b may be formed in a portion of the recess 104 positioned higher than the upper surface of the barrier interface layer pattern 116. In some example embodiments, as an upper portion of the barrier interface layer pattern 116 may be converted to the upper barrier interface layer pattern 118, the second impurity barrier layer 108b may be formed in a portion of the recess 104 positioned higher than the upper surface of the upper barrier interface layer pattern 118. The concentration of the nitrogen included in the second impurity barrier layer 108b may be higher than/greater than the concentration of the nitrogen included in the first impurity barrier layer 108.

The nitrogen included in the second impurity barrier layer 108b and an upper gate insulation layer contacting the second impurity barrier layer 108b may serve as a fixed positive charge. As the fixed positive charge is further included in the second impurity barrier layer 108b and the upper gate insulation layer in an upper portion of the recess 104, the GIDL may be decreased, e.g. may be further decreased, at a portion adjacent to the second impurity barrier layer 108b by the fixed positive charge.

In some example embodiments, the process of injecting the nitrogen may be the same as, or may be different from, the process of injecting the nitrogen into the preliminary gate insulation layer 105 described above with reference to FIG. 4. For example, the process of injecting the nitrogen may include a nitridation process using plasma, a nitridation process using heat, or a heat treatment after/or before performing a plasma nitridation process. The nitrogen source gas used in the nitridation process may include $NH_3$, $NO_2$, $N_2O$, $N_2$, or the like. In the plasma nitridation process, the plasma may be generated by a process such as RF plasma, microwave plasma, inductively coupled plasma (ICP), and remote plasma source (RPS).

In some example embodiments, the nitridation process using the plasma may be performed at 10° C. to 50° C. for 5 seconds to 200 seconds. When the heat treatment process is performed after performing the plasma nitridation process, the heat treatment process may be performed at 500° C. to 1200° C. for 1 second to 50 seconds. The nitridation process using only the heat may be performed at 100° C. to 1100° C. for 10 seconds to 200 seconds. However, each of the process condition is one of examples, and may not be limited thereto.

Figure 9:
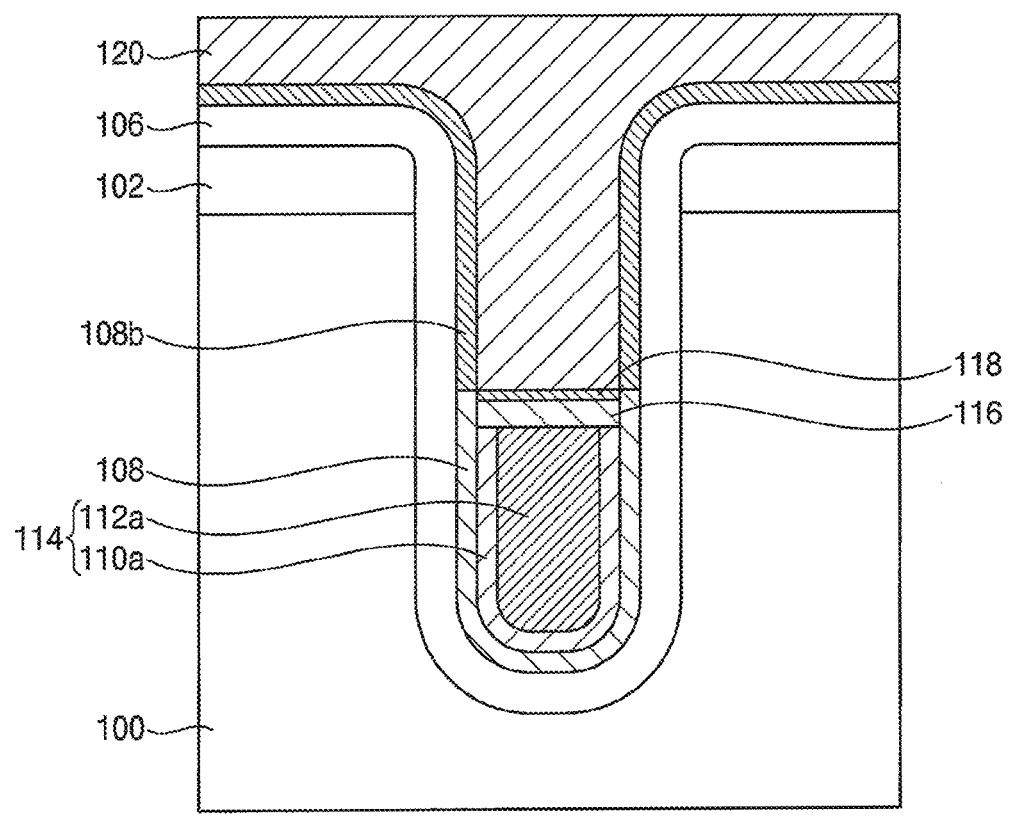

Referring to FIG. 9, a semiconductor layer may be formed on the upper barrier interface layer pattern 118 and the second impurity barrier layer 108b to fill a remaining portion of the recess 104. For example, the semiconductor layer may be or may include a doped polysilicon layer, e.g. a polysilicon layer 120 doped with N-type impurities such as at least one of arsenic or phosphorus. Hereinafter, the semiconductor layer is referred to as a polysilicon layer 120.

In some example embodiments, the impurities may be doped in-situ during a deposition process of the polysilicon layer 120. The impurities doped into the polysilicon layer 120 may have a conductivity type the same as a conductivity type of impurity regions 130 serving as source/drain regions subsequently formed.

For example, the polysilicon layer 120 may be formed with process gases such as silane and/or disilane, along with phosphine. A concentration of phosphorus may be included into/incorporated into a polysilicon layer formed with silane and/or disilane. Alternatively or additionally, the impurities may be doped during an implantation process, such as a beamline implantation process, performed after formation of an undoped polysilicon layer.

Figure 10:
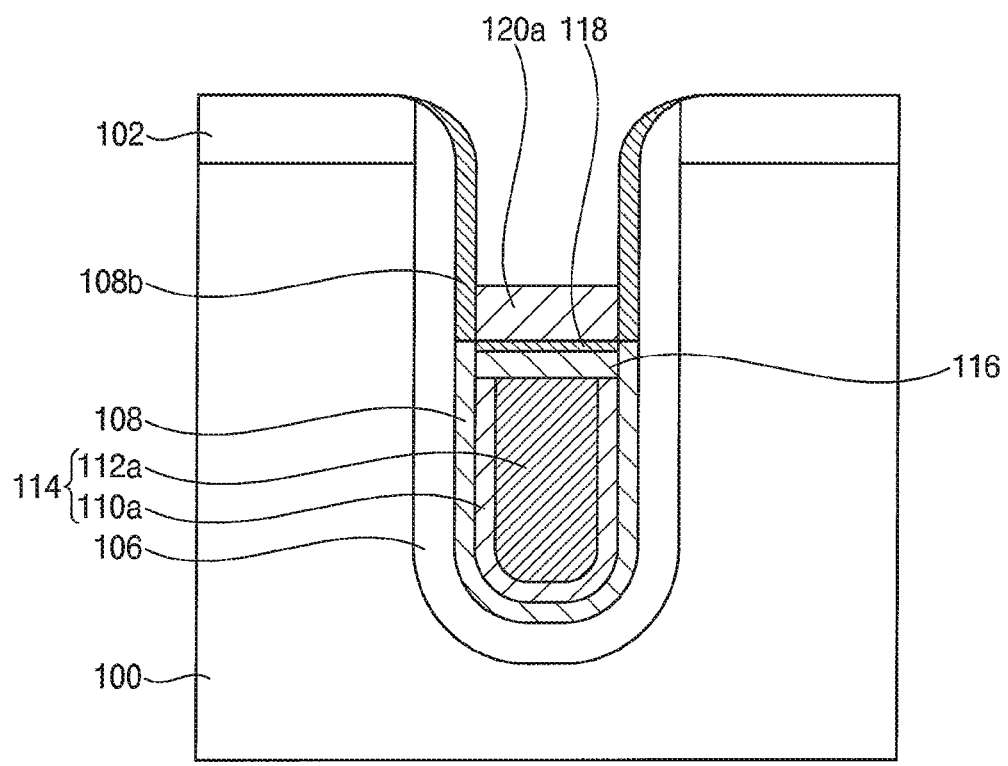

Referring to FIG. 10, the polysilicon layer 120 may be planarized until a top surface of the second impurity barrier layer 108b on the hard mask 102 may be exposed. The planarization process may include, e.g., a chemical mechanical polishing process and/or an etch back process. In some example embodiments, portions of the second impurity barrier layer 108b and the gate insulation layer 106 on the hard mask 102 may be removed, during the planarization process.

Thereafter, the polysilicon layer 120 positioned in an upper portion of the recess 104 may be etched by a subsequent etch back process to form a second gate pattern 120a.

The second gate pattern 120a may be formed on the upper barrier interface layer pattern 118. A sidewall of the second gate pattern 120a may contact the second impurity barrier layer 108b. The second gate pattern 120a may be formed in the recess 104, and an inner space of the recess 104 may remain above the second gate pattern 120a. For example, an upper surface of the second gate pattern 120a may be lower than the upper surface of the substrate 100 adjacent to the recess 104.

Figure 11:
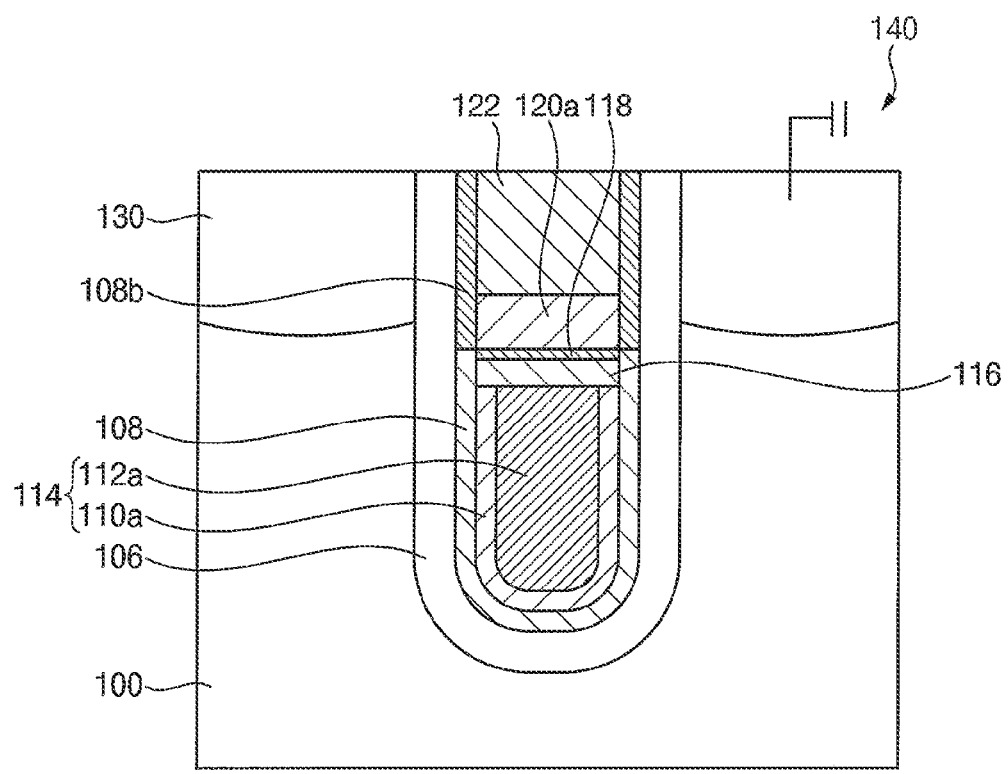

Referring to FIG. 11, a capping insulation layer may be formed on the second gate pattern 120a and the second impurity barrier layer 108b to completely fill the recess 104. Thereafter, upper surfaces of the capping insulation layer and the hard mask 102 may be planarized e.g. with a CMP process and/or an etch back process, and an upper portion of the capping insulation layer may be partially etched to form a capping insulation pattern 122 in the recess 104.

In the planarization process, the second impurity barrier layer 108b and the gate insulation layer 106 remained on the hard mask 102 may be removed, and most of the hard mask 102 may be also removed. Thereafter, the hard mask 102 may be further removed by a cleaning process or the like. Thus, the upper surface of the substrate 100 may be exposed.

Through the above process, a gate structure including the gate insulation layer 106, the first impurity barrier layer 108, the second impurity barrier layer 108b, the first gate pattern 114, the barrier interface layer pattern 116, the upper barrier interface layer pattern 118, the second gate pattern 120a, and the capping insulation pattern 122 may be formed in the recess 104.

Thereafter, the substrate 100 may be doped with impurities such as phosphorus and/or arsenic and/or carbon and/or boron to form impurity regions 130 at the substrate 100 adjacent both sidewalls of the gate structure. In some example embodiments, a bottom of the impurity region 130 may be higher than the upper surface of the first gate pattern 114; e.g. the impurity region 130 may have a concave shape. In some example embodiments, the bottom of the impurity region 130 may be disposed adjacent to a sidewall of the second gate pattern 120a. In some example embodiments, a vertical level of the bottom of the impurity region 130 may be disposed at in a range of a vertical level the sidewall of the second gate pattern 120a.

In some example embodiments the impurity regions 130 may be formed with an implantation process such as a beamline implantation process and/or a plasma assisted deposition (PLAD) process. In some example embodiments, a selective epitaxial growth (SEG) process may be performed on a surface of the substrate 100 prior to formation of the impurity regions 130; however, example embodiments are not limited thereto.

In some example embodiments, a doping process for forming the impurity region 130 may be performed before forming the recess 104 described with reference to FIG. 3.

As described above, the transistor shown in FIG. 1 may be manufactured/fabricated. In addition, wirings and/or capacitors electrically connected to the impurity regions may be further formed by subsequent processes.

Figure 12:
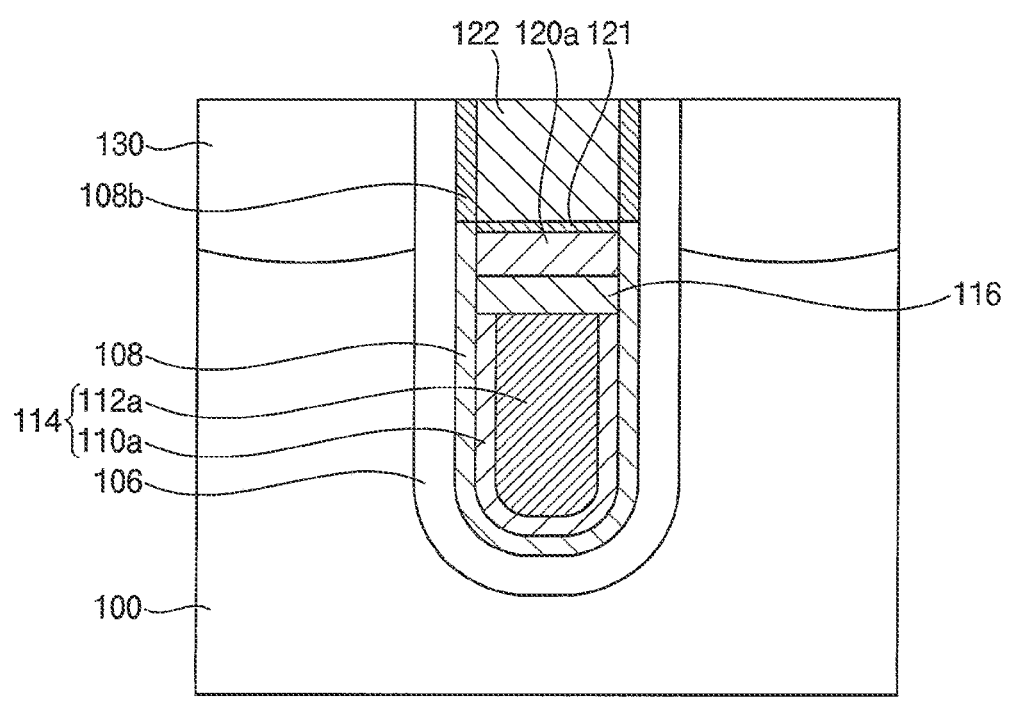

FIG. 12 is a cross-sectional view illustrating a transistor in accordance with some example embodiments. The transistor shown in FIG. 12 is the same as the transistor shown in FIG. 1, except for the second impurity barrier layer and the upper interface layer in the gate structure.

Referring to FIG. 12, the gate insulation layer 106 may be formed on sidewalls and bottom of the recess 104 of the substrate 100.

The impurity barrier layer may be formed on the gate insulation layer 106. The impurity barrier layer may include the first impurity barrier layer 108 and the second impurity barrier layer 108b thereon. In some example embodiments, the first impurity barrier layer 108 may be formed on the gate insulation layer 106 positioned lower than an upper surface of the second gate pattern 120a, and the second impurity barrier layer 108b may be formed on the gate insulation layer 106 positioned higher than the upper surface of the second gate pattern 120a. In some example embodiments, the first impurity barrier layer 108 may be formed on the gate insulation layer 106 positioned lower than an upper surface of an upper interface layer pattern 121, and the second impurity barrier layer 108b may be formed on the gate insulation layer 106 positioned higher than the upper surface of the upper interface layer pattern 121.

The concentration of the nitrogen included in each of the first and second impurity barrier layers 108 and 108b may be higher than/greater than the concentration of the nitrogen included in the gate insulation layer 106. The concentration of the nitrogen included in the second impurity barrier layer 108b may be higher than/greater than the concentration of the nitrogen included in the first impurity barrier layer 108. The concentration of the nitrogen included in the upper gate insulation layer contacting the second impurity barrier layer 108b may be higher than/greater than the concentration of the nitrogen included in the lower gate insulation layer contacting the first impurity barrier layer 108.

The first gate pattern 114, the barrier interface layer pattern 116, and the second gate pattern 120a may be formed on the first impurity barrier layer 108 in the recess 104. For example, an upper barrier interface layer pattern may not be formed on the barrier interface layer pattern 116.

In some example embodiments, the upper interface layer pattern 121 may be formed on the second gate pattern 120a. The upper interface layer pattern 121 may include a material of the second gate pattern 120a and may further include nitrogen, e.g. an additional nitrogen. The upper interface layer pattern 121 may include, e.g., silicon nitride and/or silicon oxynitride.

The capping insulation pattern 122 may be formed on the upper interface layer pattern 121. The capping insulation pattern 122 may include, e.g., silicon nitride. In some example embodiments, the upper interface layer pattern 121 and the capping insulation pattern 122 may include the same material (e.g., silicon nitride), and thus the upper interface layer pattern 121 and the capping insulation pattern 122 may not be distinguished from each other.

Therefore, a gate structure including the gate insulation layer 106, the first impurity barrier layer 108, the second impurity barrier layer 108b, the first gate pattern 114, the barrier interface layer pattern 116, and the second gate pattern 120a, the upper interface layer pattern 121 and the capping insulation pattern 122 may be formed in the recess 104.

Figure 13:
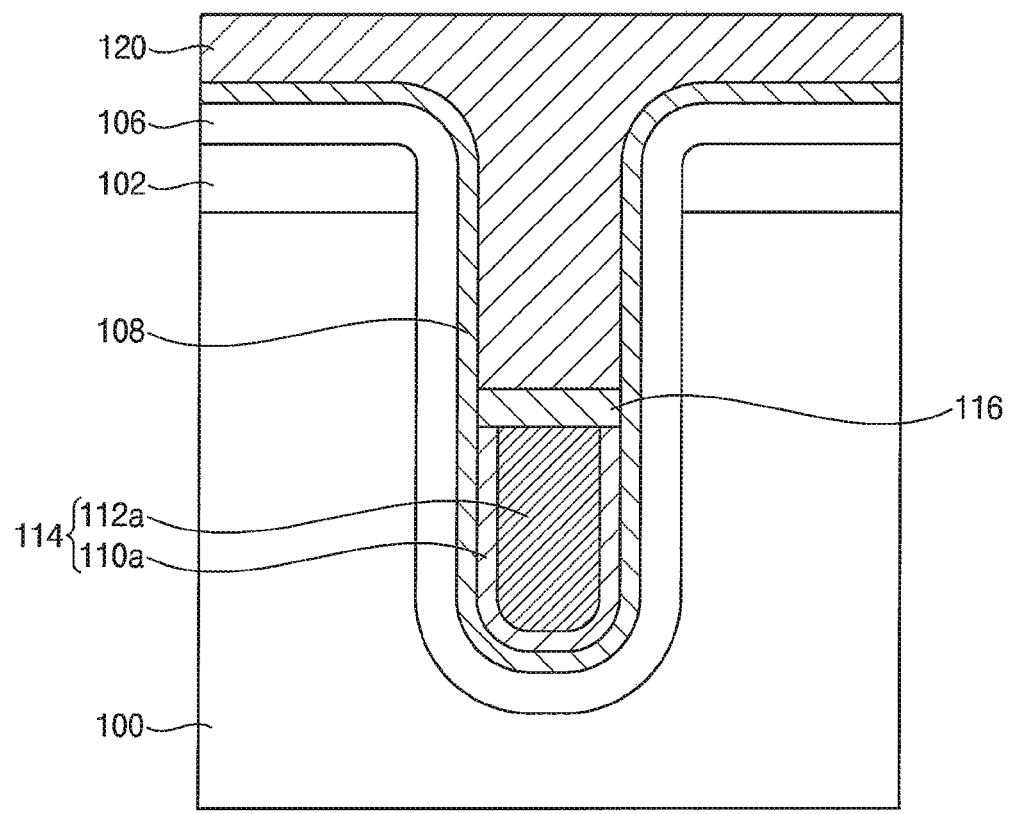
Figure 14:
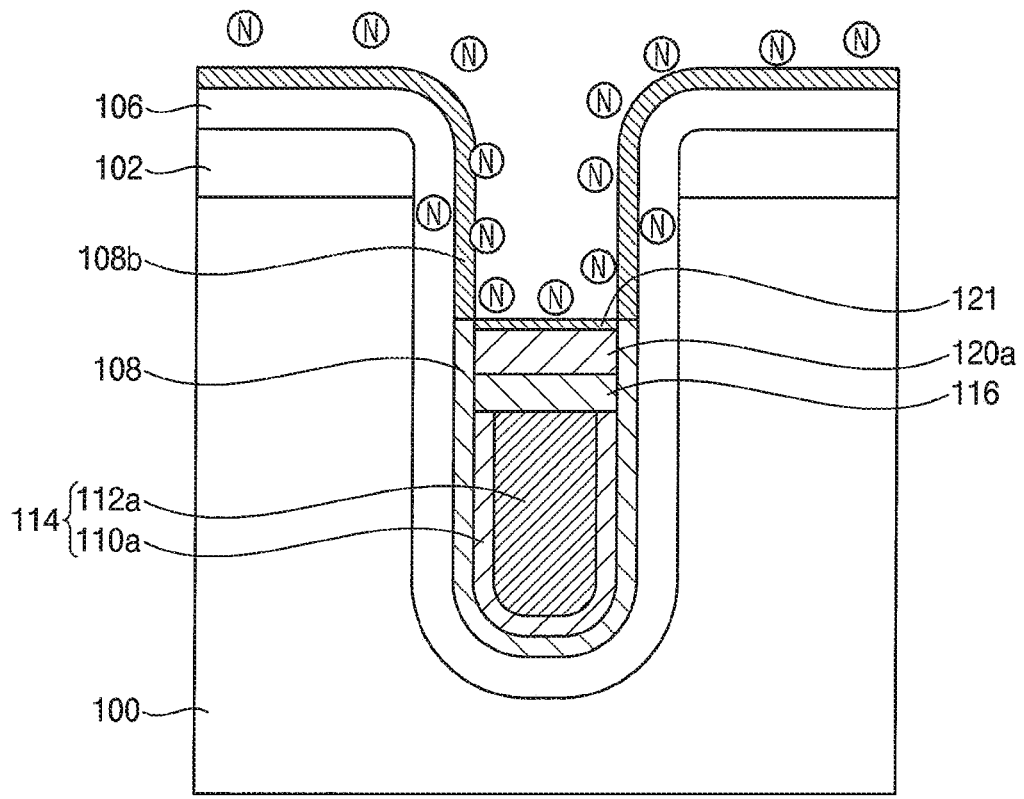

FIGS. 13 and 14 are cross-sectional views illustrating a method of manufacturing/fabricating a transistor in accordance with some example embodiments.

Referring to FIG. 13, first, processes substantially the same as or similar to those illustrated with reference to FIGS. 3 to 7 may be performed to form the barrier interface layer pattern 116 on the first gate pattern 114.

Then, a semiconductor layer may be formed on the barrier interface layer pattern 116 and the first impurity barrier layer 108 to fill a remaining portion of the recess 104. For example, the semiconductor layer may be a doped polysilicon layer, e.g. a polysilicon layer 120 doped with N-type impurities.

Referring to FIG. 14, the polysilicon layer 120 may be planarized until a top surface of the first impurity barrier layer 108 on the hard mask 102 may be exposed. The planarization process may include, e.g., a chemical mechanical polishing process and/or an etch back process. In some example embodiments, portions of the first impurity barrier layer 108 and the gate insulation layer 106 on the hard mask 102 may be removed, during the planarization process.

Thereafter, the polysilicon layer 120 positioned in an upper portion of the recess 104 may be partially removed by an etch back process to form a second gate pattern 120a.

Nitrogen may be isotropically injected onto an upper surface of the second gate pattern 120a and an exposed first impurity barrier layer 108.

In some example embodiments, the process of injecting the nitrogen may include a plasma nitridation process, a nitridation process using heat, or a heat treatment after/or before performing a plasma nitridation process. A nitrogen source gas used in the nitridation process may include $NH_3$, $NO_2$, $N_2O$, $N_2$, or the like. In the plasma nitridation process, the plasma may be generated by a process such as RF plasma, microwave plasma, inductively coupled plasma (ICP), and remote plasma source (RPS).

In some example embodiments, the nitridation process using the plasma may be performed at 10° C. to 50° C. for 5 seconds to 200 seconds. When the heat treatment process is performed after performing the plasma nitridation process, the heat treatment process may be performed at 500° C. to 1200° C. for 1 second to 50 seconds. The nitridation process using the heat may be performed at 100° C. to 1100° C. for 10 seconds to 200 seconds. However, each of the process condition is one of examples, and may not be limited thereto.

Thus, an upper interface layer pattern 121 may be formed on the second gate pattern 120a. The upper interface layer pattern 121 may have a concentration of the nitrogen higher than/greater than a concentration of the nitrogen included in the second gate pattern 120*a*. Additionally or alternatively, a concentration of the nitrogen included in the exposed first impurity barrier layer may be increased so that the exposed first impurity barrier layer may be converted into the second impurity barrier layer 108*b*.

Additionally or alternatively, the nitrogen may be injected onto the gate insulation layer 106 contacting the second impurity barrier layer 108*b*, so that a concentration of the nitrogen included in the gate insulation layer 106 positioned higher than the upper surface of the second gate pattern 120*a* may be increased. However, the concentration of the nitrogen included in each of the gate insulation layer 106 and the first impurity barrier layer 108 positioned lower than the upper surface of the second gate pattern 120*a* may not be increased by the process of injecting the nitrogen.

Therefore, the first impurity barrier layer 108 may be formed in a portion of the recess 104 positioned lower than the upper surface of the second gate pattern 120*a*, and the second impurity barrier layer 108*b* may be formed in a portion of the recess 104 positioned higher than the upper surface of the second gate pattern 120*a*. In some example embodiments, as an upper portion of the second gate pattern 120*a* may be converted to the upper barrier layer pattern 121, the second impurity barrier layer 108*b* may be formed in a portion of the recess 104 positioned higher than the upper surface of the upper barrier layer pattern 121.

Further, the concentration of the nitrogen included in the gate insulation layer 106 positioned higher than the upper surface of the second gate pattern 120*a* may be higher than the concentration of the nitrogen included in the gate insulation layer 106 positioned lower than the upper surface of the second gate pattern 120*a*.

Thereafter, processes substantially the same as or similar to those illustrated with reference to FIG. 11 may be performed. Thus, the transistor shown in FIG. 12 may be manufactured.

Figure 15:
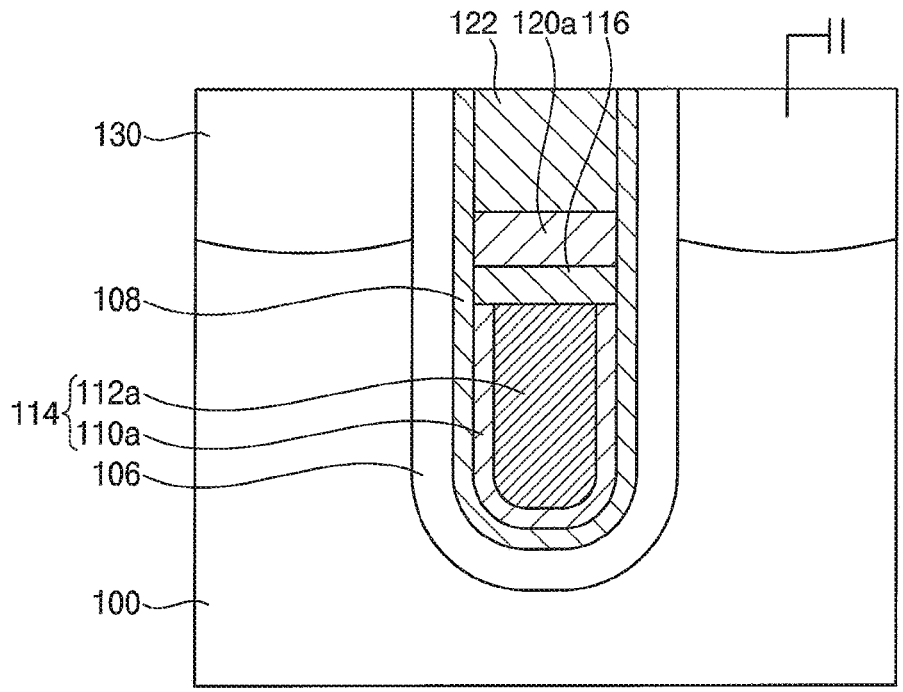

FIG. 15 is a cross-sectional view illustrating a transistor in accordance with some example embodiments. The transistor shown in FIG. 15 is the same as the transistor shown in FIG. 1, except that the second impurity barrier layer and the upper barrier interface layer pattern are not formed in the gate structure.

Referring to FIG. 15, the gate insulation layer 106 may be formed, e.g. may be conformally formed on sidewalls and bottom of the recess 104 of the substrate 100.

The first impurity barrier layer 108 may be formed on the gate insulation layer 106. The first impurity barrier layer 108 may cover an upper surface of the gate insulation layer 106.

The first impurity barrier layer 108 may be formed on the surface of the gate insulation layer 106 by injecting nitrogen onto the upper surface of the gate insulation layer 106. Therefore, the first impurity barrier layer 108 may include a material of the gate insulation layer 106 and may further include the nitrogen.

The first gate pattern 114, the barrier interface layer pattern 116, the second gate pattern 120*a*, and the capping insulation pattern 122 filling the recess 104 may be formed on the first impurity barrier layer 108.

Thus, a gate structure including the first gate pattern 114, the barrier interface layer pattern 116, the second gate pattern 120*a* and the capping insulation pattern 122 may be formed in the recess 104.

As such, only the first impurity barrier layer 108 may be formed on the gate insulation layer 106, and the second impurity barrier layer may not be formed on the gate insulation layer 106. Further, the upper interface layer pattern may not be formed on the second gate pattern 120*a*.

The semiconductor device shown in FIG. 15 may be manufactured by the same process as illustrated with reference to FIGS. 3 to 11. However, the process illustrated with reference to FIG. 8 may not be performed.

Figure 16:
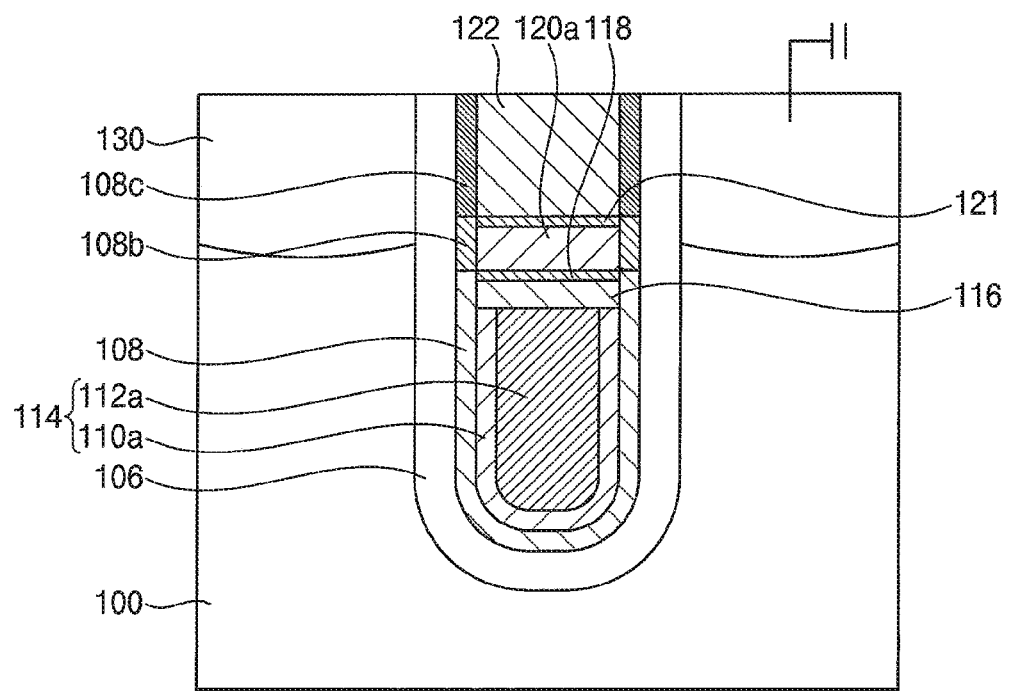

FIG. 16 is a cross-sectional view illustrating a transistor in accordance with some example embodiments. The transistor shown in FIG. 16 may be the same as the transistor shown in FIG. 1, except that a third impurity barrier layer and an upper interface layer pattern are further formed in the gate structure.

Referring to FIG. 16, a gate insulation layer 106 may be formed, e.g. conformally formed on sidewalls and bottom of the recess 104 of the substrate 100.

An impurity barrier layer may be formed on the gate insulation layer 106. The impurity barrier layer may include first to third impurity barrier layers 108, 108*b*, and 108*c*.

In some example embodiments, the first impurity barrier layer 108 may be formed on the gate insulation layer 106 positioned lower than an upper surface of the barrier interface layer pattern 116. The second impurity barrier layer 108*b* may be formed on the gate insulation layer 106 positioned between the upper surface of the barrier interface layer pattern 116 and an upper surface of the second gate pattern 120*a*. The third impurity barrier layer 108*c* may be formed on the gate insulation layer 106 positioned higher than the upper surface of the second gate pattern 120*a*.

The first to third impurity barrier layers 108, 108*b* and 108*c* may be formed on the surface of the gate insulation layer 106 by injecting nitrogen into a material of the gate insulation layer 106.

A concentration of the nitrogen included in the second impurity barrier layer 108*b* may be higher than/greater than a concentration of the nitrogen included in the first impurity barrier layer 108. A concentration of the nitrogen included in the third impurity barrier layer 108*c* may be higher than/greater than the concentration of the nitrogen included in the second impurity barrier layer 108*b*.

The first gate pattern 114, the barrier interface layer pattern 116, and the upper barrier interface layer pattern 118 may be formed on the first impurity barrier layer 108 in the recess. The second gate pattern 120*a* and the upper interface layer pattern 121 may be formed on the upper barrier interface layer pattern 118. The second gate pattern 120*a* may contact the second impurity barrier layer 108*b*. The capping insulation pattern 122 may be formed on the upper interface layer pattern 121. The third impurity barrier layer 108*c* may contact the capping insulation pattern 122.

Therefore, a gate structure including the gate insulation layer 106, the first impurity barrier layer 108, the second impurity barrier layer 108*b*, the third impurity barrier layer 108*c*, the first gate pattern 114, the barrier interface layer pattern 116, the upper barrier interface layer pattern 118, the second gate pattern 120*a*, the upper interface layer pattern 121, and the capping insulation pattern 122 may be formed in/within the recess 104.

The semiconductor device shown in FIG. 16 may be manufactured by the same process as illustrated with reference to FIGS. 3 to 11. However, after performing the process illustrated with reference to FIG. 10, a process of injecting the nitrogen onto the upper surface of the second gate pattern 120*a* and the exposed second impurity barrier layer 108*b* may be further performed. Thus, the third impurity barrier layer 108*c* and the upper interface layer pattern 121 may be further formed. The process of injecting the nitrogen may be substantially the same as illustrated with reference to FIG. 14.

Figure 17:
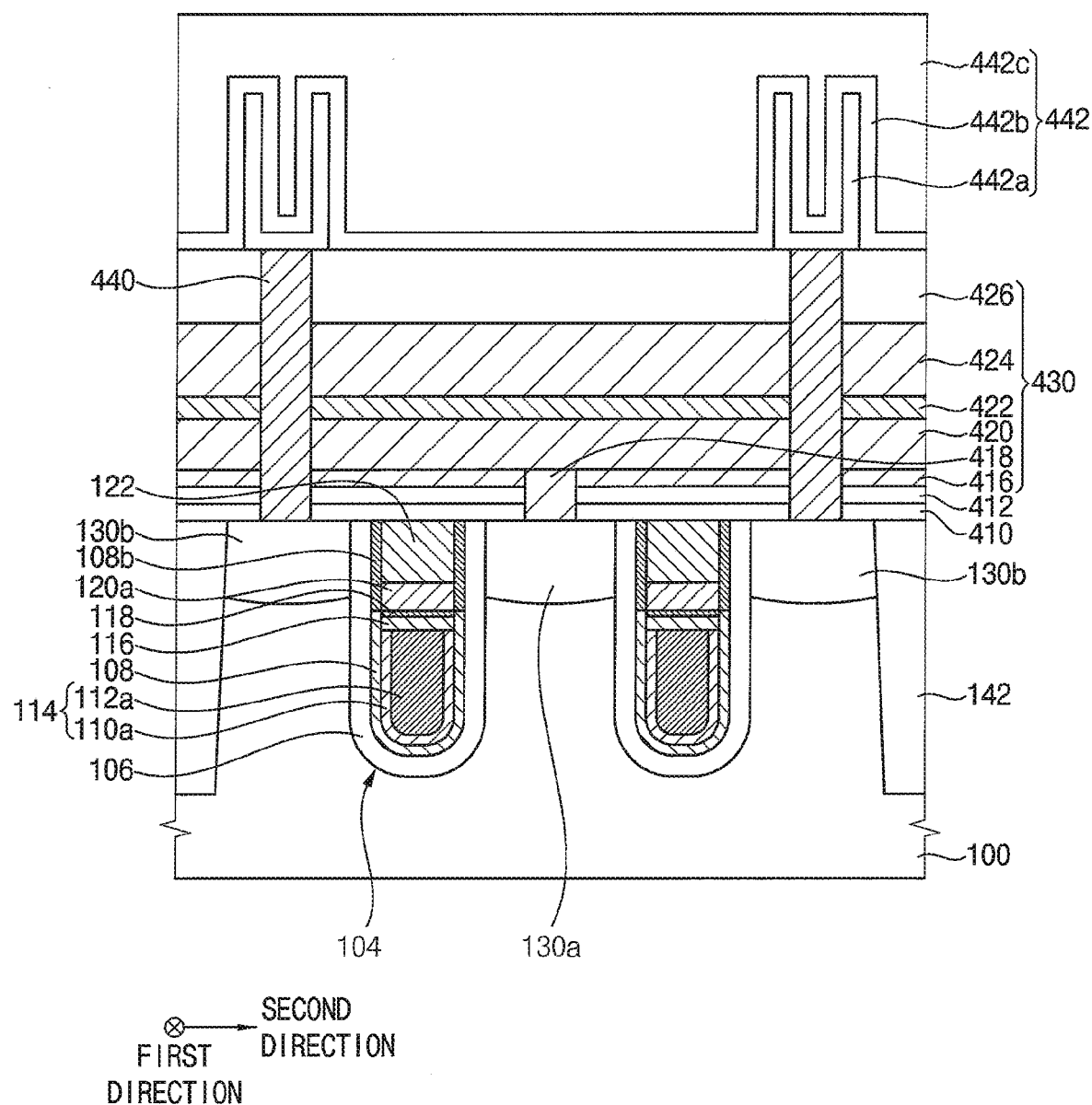

FIG. 17 is a cross-sectional view illustrating a semiconductor device in accordance with some example embodiments.

The semiconductor device may be or correspond to a memory device such as a DRAM device including one of transistors in accordance with some example embodiments. Therefore, detailed description of the transistor may be omitted. FIG. 17 shows the buried channel array transistor shown in FIG. 1.

Referring to FIG. 17, an isolation pattern 142 may be formed in an isolation trench of a substrate 100, e.g. may be formed with a shallow trench isolation (STI) process, and an active region may be disposed between the isolation patterns 142. A portion of the isolation pattern 142 may serve as a device isolation region.

The substrate may include a first recess portion 104, and a gate structure may be formed in the first recess portion 104.

In some example embodiments, the gate structure may have a stacked structure the same as a stacked structure of the gate structure illustrated with reference to FIG. 1. The gate structure may include the gate insulation layer 106, the first impurity barrier layer 108, the second impurity barrier layer 108b, the first gate pattern 114, the barrier interface layer pattern 116, the upper barrier interface layer pattern 118, the second gate pattern 120a and the capping insulation pattern 122.

In some example embodiments, although not shown, the gate structure may have a stacked structure the same as a stacked structure of one of the gate structures shown in FIGS. 12, 15, and 16.

In some example embodiments, each of the gate structures may extend in a first direction parallel to the surface of the substrate 100. A plurality of the gate structures may be arranged in a second direction parallel to the surface of the substrate 100 and perpendicular to the first direction.

In some example embodiments, the active region may have an isolated shape. The active region may be disposed such that a direction oblique to the first direction may be a longitudinal direction.

First and second impurity regions 130a and 130b may be formed at an upper portion of the substrate 100 of the active region between the gate structures. The first and second impurity regions 130a and 130b may serve as source/drain regions. For example, the substrate 100 may include the first impurity region 130a electrically connected to a bit line structure 430 (e.g. a column structure) and the second impurity region 130b electrically connected to another device such as a capacitor 442 and/or a non-linear device having hysteresis properties.

A pad pattern 410, a first etch stop pattern 412, and a first conductive pattern 416 may be stacked on the active region, the isolation pattern 142 and the gate structure. The pad pattern 410 may include, e.g., an oxide such as silicon oxide, and the first etch stop pattern 412 may include, e.g., a nitride such as silicon nitride. The first conductive pattern 416 may include, e.g., polysilicon doped with N-type impurities such as arsenic and/or phosphorus.

A stacked structure including the pad pattern 410, the first etch stop pattern 412, and the first conductive pattern 416 may include a second recess portion. The second recess portion may be positioned at a portion of the substrate 100 between the gate structures. An upper surface of the first impurity region 130a may be exposed at a bottom of the second recess portion.

A second conductive pattern 418 may be formed in the second recess portion. The second conductive pattern 418 may include, e.g., polysilicon doped with N-type impurities such as arsenic or phosphorus. For example, the second conductive pattern 418 may contact the first impurity region 130a.

A third conductive pattern 420 may be stacked on the first conductive pattern 416 and the second conductive pattern 418. The third conductive pattern 420 may include, e.g., polysilicon doped with an N-type impurities. For example, the first to third conductive patterns 416, 418, and 420 may include polysilicon, which is the same material. Thus, the first to third conductive patterns 416, 418, and 420 may be merged into one pattern, e.g. merged homogenously into one pattern. A second barrier metal pattern 422, a second metal pattern 424, and a hard mask pattern 426 may be stacked on the third conductive pattern 420.

A stacked structure including the first conductive pattern 416, the second conductive pattern 418, the third conductive pattern 420, the second barrier metal pattern 422, the second metal pattern 424, and the hard mask pattern 426 may serve as a bit line structure 430. For example, the second conductive pattern 418 may serve as a bit line contact, and the first conductive pattern 416, the third conductive pattern 420, the second barrier metal pattern 422 and the second metal pattern 424 may serve as a bit line. The bit line structure 430 may extend in the second direction, and a plurality of the bit line structures 430 may be arranged in the first direction.

In some example embodiments, a spacer (not shown) may be formed on sidewalls of the bit line structure 430. The spacer may be formed of or include a nitride.

A first insulating interlayer (not shown) may be formed to fill a space between the bit line structures 430. The first insulating interlayer may include silicon oxide.

A contact plug 440 may pass through the first insulating interlayer, the first etch stop pattern 412 and the pad pattern 410 so that the contact plug 440 may contact the second impurity region 130b. The contact plug 440 may be disposed between the bit line structures 430. The contact plug 440 may be formed of or include doped polysilicon; however, example embodiments are not limited thereto.

A capacitor 442 may be electrically connected to the contact plug 440. The capacitor 442 may include a lower electrode 442a, a dielectric layer 442b, and an upper electrode 442c. The lower electrode of the capacitor 442 may have a cylindrical shape and/or a pillar shape.

The memory cell of the DRAM device may include the transistor having improved or excellent characteristics. Therefore, the memory cell may have improved excellent operating characteristics and/or electrical characteristics.

The impurity barrier layer may be applied to transistors having other structures. Hereinafter, a semiconductor device including a vertical channel transistor including the impurity barrier layer is described.

Figure 18:
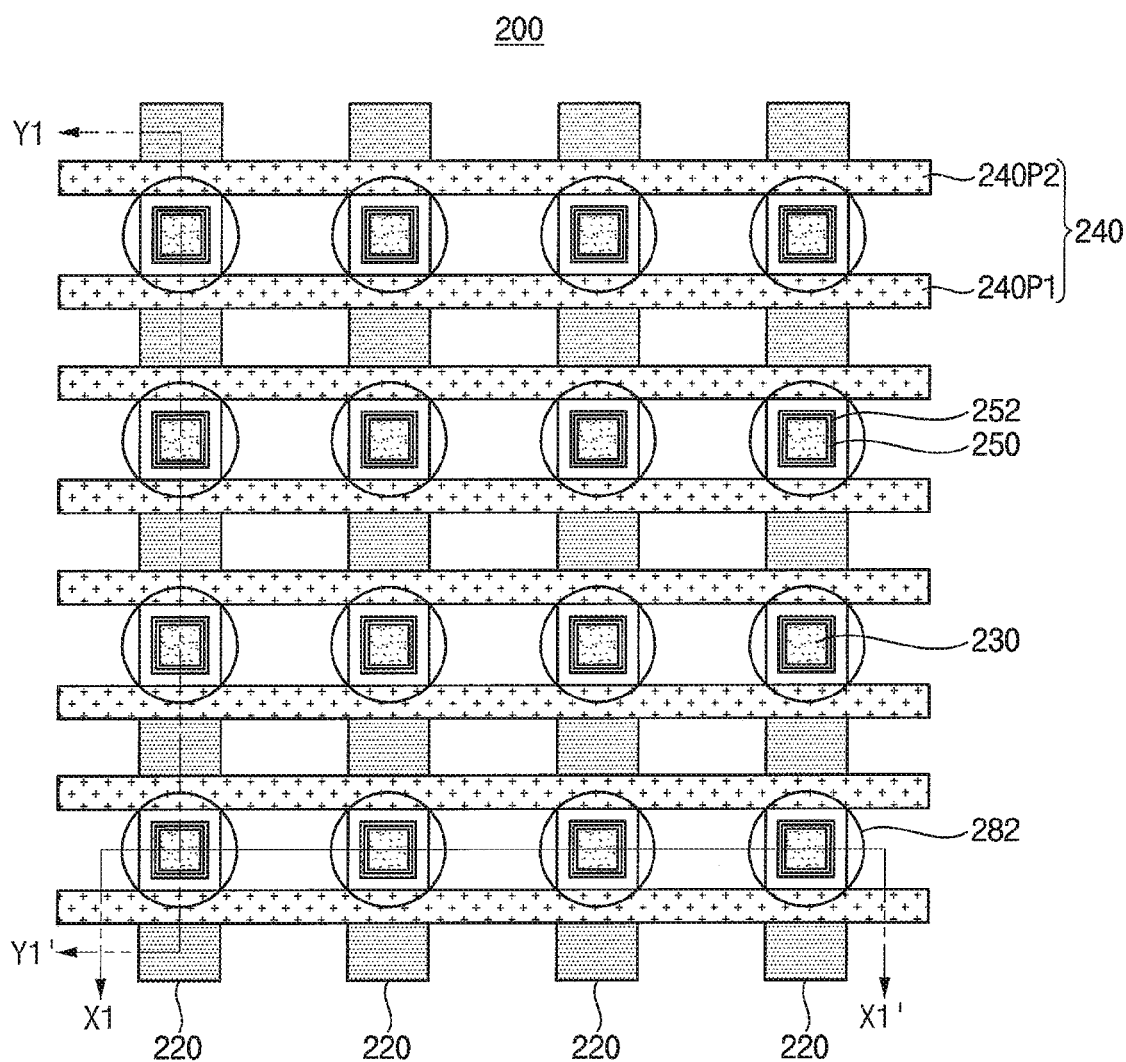
Figure 19:
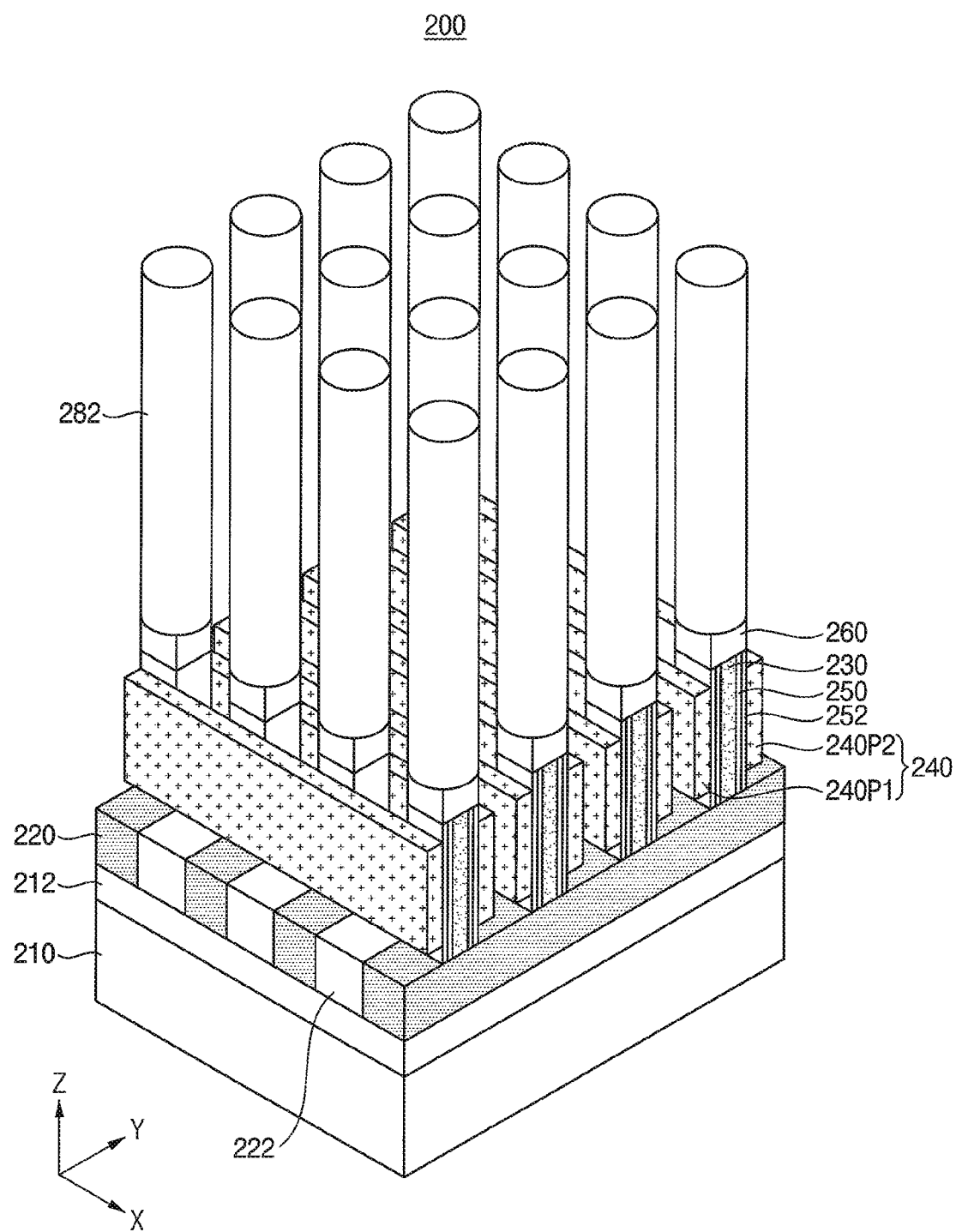
Figure 20:
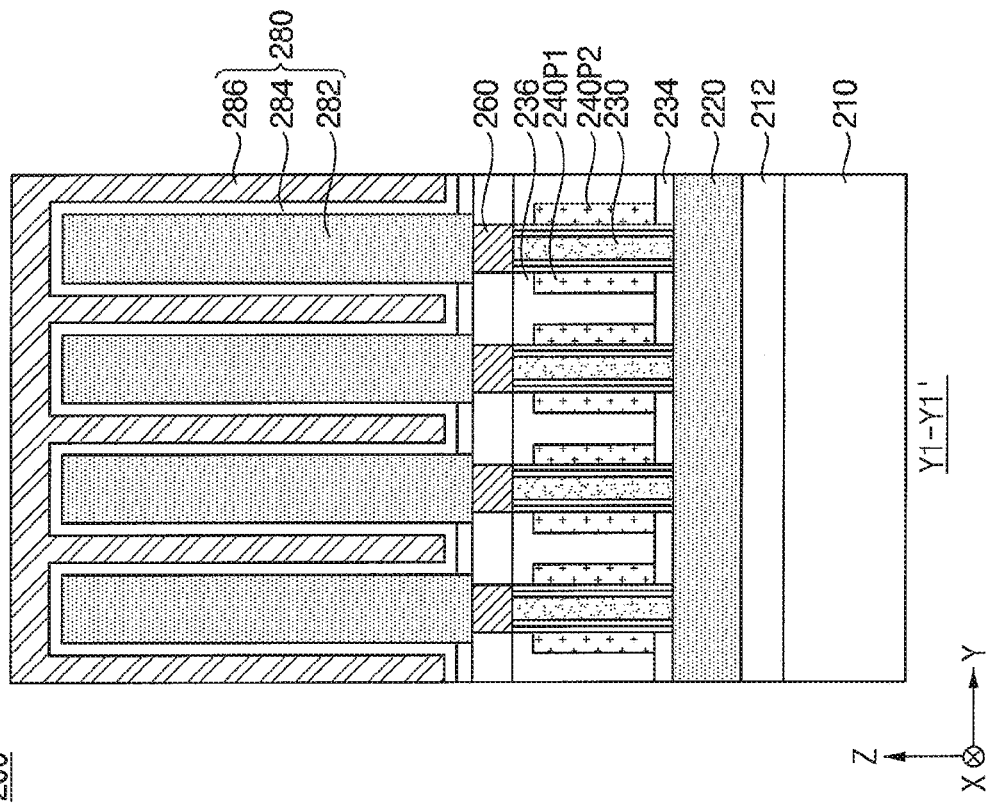

FIG. 18 is a layout diagram of a semiconductor device in accordance with some example embodiments. FIG. 19 is a perspective view of a semiconductor device in accordance with some example embodiments. FIG. 20 is a cross-sectional view taken along a line X1-X1' and a line Y1-Y1' of FIG. 18.

Referring to FIGS. 18 to 20, the semiconductor device 200 may include a substrate 210, a plurality of first conductive lines 220, a channel layer 230, a gate electrode 240, a gate insulation layer 250, an impurity barrier layer 252 and a capacitor structure 280. The semiconductor device 200 may be or may include a DRAM device including a vertical channel transistor (VCT). A channel of the vertical channel transistor may extend in a vertical direction from an upper surface of the substrate 210.

A lower insulation layer 212 may be disposed on the substrate 210. A plurality of first conductive lines 220 may be formed on the lower insulation layer 212. The first conductive lines 220 may be spaced apart from each other in the first direction (e.g., X direction), and the first conductive lines 220 may extend in the second direction (e.g., Y direction). A plurality of first insulation patterns 222 may be disposed on the lower insulation layer 212 to fill a space between the plurality of first conductive lines 220. The plurality of first insulation patterns 222 may extend in the second direction (e.g., Y direction). Upper surfaces of the plurality of first insulation patterns 222 may be coplanar with upper surfaces of the plurality of first conductive lines 220. The plurality of first conductive lines 220 may serve as bit lines of the semiconductor device 200.

In some example embodiments, the plurality of first conductive lines 220 may include doped polysilicon, a metal, conductive metal nitride, conductive metal silicide, conductive metal oxide, or a combination thereof. For example, the plurality of first conductive lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. However, materials of the plurality of first conductive lines 220 may not be limited thereto. The plurality of first conductive lines 220 may include a single layer or multiple layers of the materials. In some example embodiments, the plurality of first conductive lines 220 may include a 2-dimensional semiconductor material, e.g., graphene, carbon nanotube, boron-nitride, or combination thereof.

The channel layer 230 may be formed on the plurality of first conductive lines 220. The channel layers may be arranged in a matrix shape which are spaced apart from each other in a first direction (X direction) and a second direction (Y direction). The matrix shape may be rectangular, e.g. may be square; however, example embodiments are not limited thereto, and the matrix shape may have another shape such as a rhombic shape. The channel layer 230 may have a first width in the first direction (X direction) and a first height in a third direction (e.g., Z direction). The first height may be greater than the first width. For example, the first height may be about 2 times to about 10 times of the first width, but may not be limited thereto. A lower portion of the channel layer 230 may serve as a first source/drain region (not shown), and an upper portion of the channel layer 230 may serve as a second source/drain region (not shown). A portion of the channel layer 230 between the first and second source/drain regions may serve as a channel region (not shown).

In some example embodiments, the channel layer 230 may include an oxide semiconductor. For example, the oxide semiconductor may include at least one of InxGayZnzO, InxGaySizO, InxSnyZnzO, InxZnyO, ZnxO, ZnxSnyO, ZnxOyN, ZrxZnySnzO, SnxO, HfxInySizOnz, GaxOnzOnz, AlxZnySnzO, YbxGayZnzO, InxGayO.

The channel layer 230 may include a single layer or multiple layers of the oxide semiconductor. In some example embodiments, the channel layer 230 may have a bandgap energy greater than a bandgap energy of silicon. For example, the channel layer 230 may have the bandgap energy of about 1.5 eV to about 5.6 eV. For example, when the channel layer 230 has the bandgap energy of about 2.0 eV to about 4.0 eV, the channel layer 230 may have optimal performance. For example, the channel layer 230 may have polycrystalline or amorphous. In some example embodiments, the channel layer 230 may include 2-dimensional semiconductor material, e.g., graphene, carbon nanotube, boron-nitride, or a combination thereof.

The gate electrode 240 may be formed on both sidewalls of the channel layer 230, and the gate electrode 240 may extend in the first direction (X direction). The gate electrode 240 may include a first sub-gate electrode 240P1 facing a first sidewall of the channel layer 230 and a second sub-gate electrode 240P2 facing a second sidewall opposite to the first sidewall of the channel layer 230. Each of the channel layers 230 may be disposed between the first sub-gate electrode 240P1 and the second sub-gate electrode 240P2, and thus the vertical channel transistor may have a dual gate transistor structure. However, a structure of the transistor may not be limited thereto. For example, the second sub-gate electrode 240P2 may be omitted, and may include only the first sub-gate electrode 240P1 facing the first sidewall of the channel layer 230. In this case, the vertical channel transistor may have a single gate transistor structure.

The gate electrode 240 may include doped polysilicon, metal, conductive metal nitride, conductive metal silicide, conductive metal oxide, or a combination thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. However, the material of the gate electrode 240 may not be limited thereto.

An impurity barrier layer 252 may be formed on the gate insulation layer 250.

A stacked structure including the gate insulation layer 250 and the impurity barrier layer 252 may surround the sidewalls of the channel layer 230, and the stacked structure may be interposed between the channel layer 230 and the gate electrode 240. For example, the gate insulation layer 250 may surround an entire sidewall of the channel layer 230. The impurity barrier layer 252 may surround the gate insulation layer 250.

The impurity barrier layer 252 may include a material of the gate insulation layer 250 and may include further nitrogen. The impurity barrier layer 252 may prevent or reduce the likelihood of impurities including reactive gases and/or reactants from diffusing and/or penetrating into the gate insulation layer 250, in performing processes.

A portion of a sidewall of the gate electrode 240 may contact the impurity barrier layer 252. In some example embodiments, the gate insulation layer 250 may extend in an extension direction of the gate electrode 240 (i.e., the first direction, X direction), and thus the impurity barrier layer 252 may contact sidewalls of the gate electrode 240 facing the channel layer.

In some example embodiments, the gate insulation layer 250 may include, e.g., a silicon oxide layer, a silicon oxynitride layer, a high dielectric layer having a higher dielectric constant than that of the silicon oxide layer, or a combination thereof. The high dielectric layer may include a metal oxide or a metal oxynitride. For example, the high dielectric layer may include HfO2, HfSiO, HfSiON, HfTaO, HfTiO, HfZrO, ZrO$_2$, Al$_2$O3, or a combination thereof, but may not be limited thereto.

A plurality of second insulation patterns 232 may be formed on the plurality of first insulation patterns 222, and the plurality of first insulation patterns 222 may extend in the second direction (e.g., Y direction). The channel layer 230 may be disposed between two adjacent second insulation patterns. A first buried layer 234 and a second buried layer 236 may be disposed at a space between two adjacent channel layers 230 in two adjacent second insulation patterns 232. The first buried layer 234 may be disposed at a bottom of the space between two adjacent channel layers 230, and the second buried layer 236 may be formed on the first buried layer 234 to fill a remaining space between two adjacent channel layers 230. An upper surface of the second buried layer 236 may be coplanar with an upper surface of the channel layer 230, and the second buried layer 236 may cover the upper surface of the gate electrode 240. In some example embodiments, the plurality of second insulation patterns 232 and the plurality of first insulation patterns 222 may be formed as the same material layer to have continuous shape. In some example embodiments, the second buried layer 236 and the first buried layer 234 may be formed as the same material layer to have continuous shape.

A capacitor contact 260 may be formed on the channel layer 230. The capacitor contacts 260 may be arranged to vertically overlap the channel layer 230. The capacitor contacts 260 may be arranged in a matrix shape which are spaced apart from each other in the first direction (X direction) and the second direction (Y direction). The capacitor contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but may not be limited thereto. An upper insulation layer 262 may surround sidewalls of the capacitor contact 260 formed on the plurality of second insulation patterns 232 and the second buried layer 236.

An etch stop layer 270 may be disposed on the upper insulation layer 262, and a capacitor structure 280 may be disposed on the etch stop layer 270. The capacitor structure 280 may include a lower electrode 282, a dielectric layer 284, and an upper electrode 286.

The lower electrode 282 may pass through the etch stop layer 270, and the lower electrode 282 may be electrically connected to the upper surface of the capacitor contact 260. The lower electrode 282 may have a pillar shape extending in the third direction (Z direction), but a shape of the lower electrode 282 may not be limited thereto. In some example embodiments, the lower electrode 282 may be arranged to vertically overlap the capacitor contact 260. The lower electrodes 282 may be arranged in a matrix shape which are spaced apart from each other in the first direction (X direction) and the second direction (Y direction). Alternatively, a landing pad (not shown) may be further disposed between the capacitor contact 260 and the lower electrode 282, and the lower electrode 282 may be arranged in a hexagonal shape.

Figure 21:
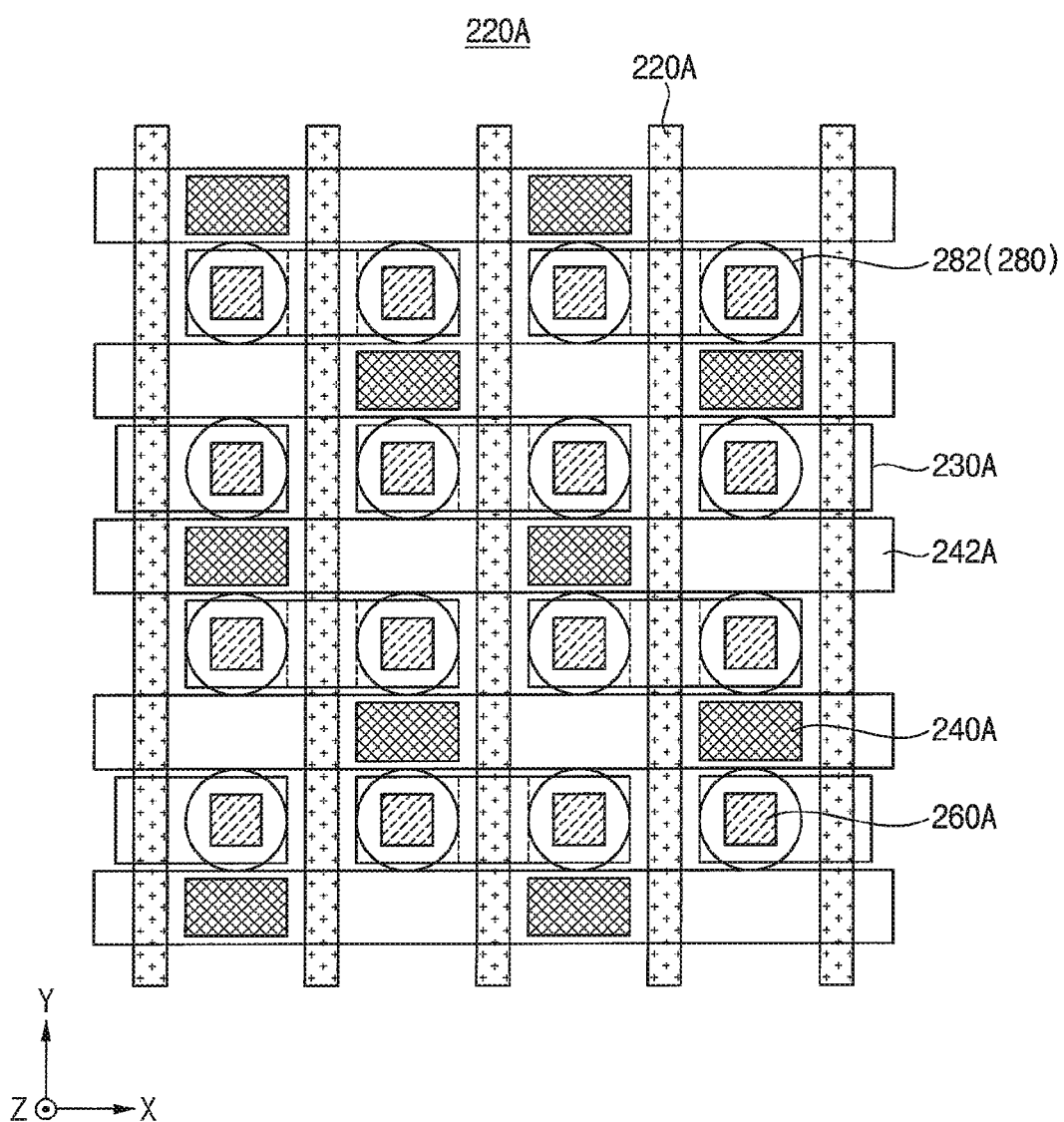
Figure 22:
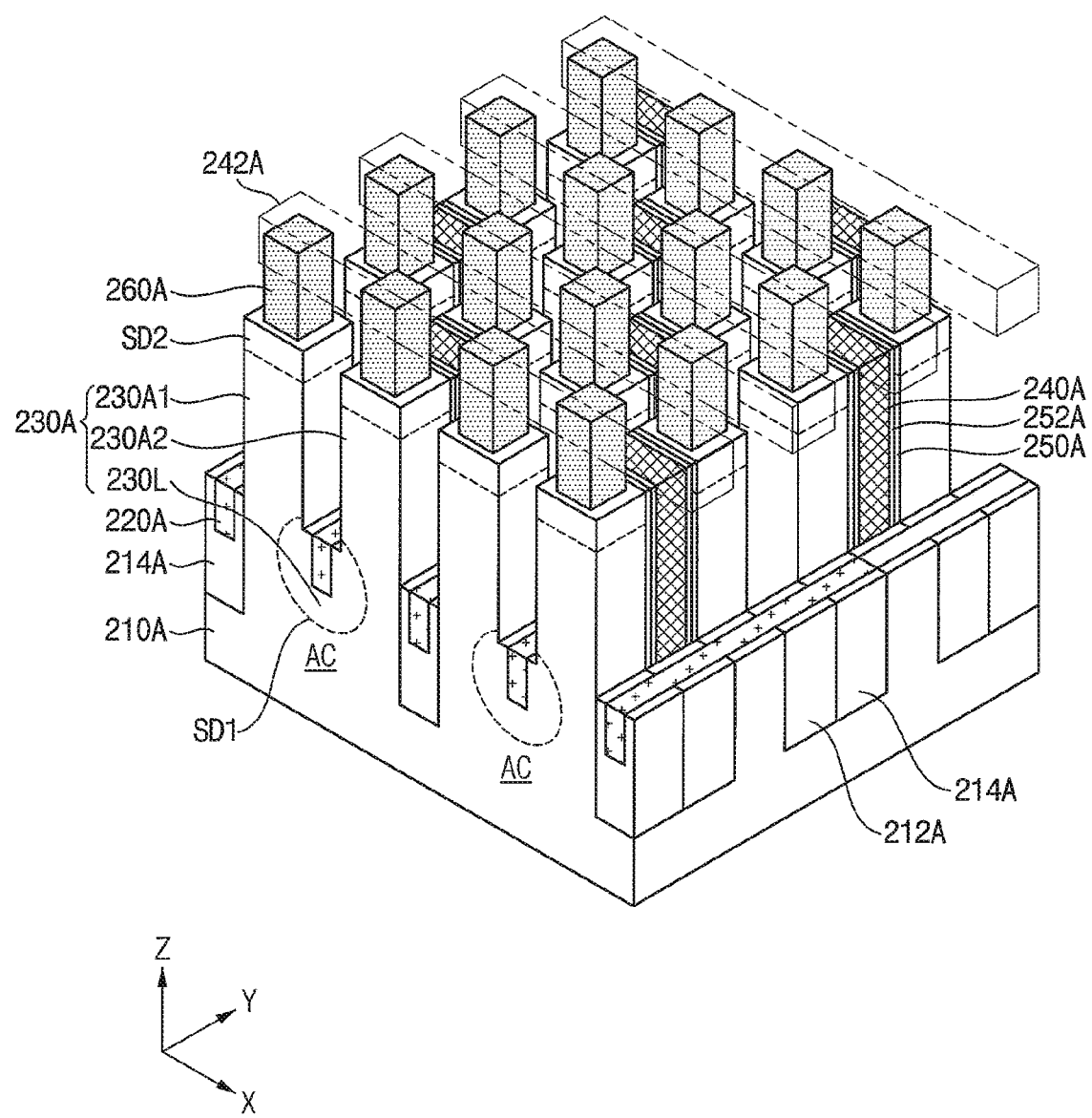

FIG. 21 is a layout diagram illustrating a semiconductor device in accordance with some example embodiments. FIG. 22 is a perspective view illustrating a semiconductor device in accordance with some example embodiments.

Referring to FIGS. 21 and 22, the semiconductor device 200A may include a substrate 210A, a plurality of first conductive lines 220A, a channel structure 230A, a contact gate electrode 240A, a plurality of second conductive lines 242A, and a capacitor structure 280. The semiconductor device 200A may be or may include a DRAM device including a vertical channel transistor VCT.

The substrate 210A may include a plurality of active regions AC defined by a first device isolation layer 212A and a second device isolation layer 214A. The channel structure 230A may be disposed in each of active regions AC. The channel structure 230A may include a first active pillar 230A1 and a second active pillar 230A2 extending in the vertical direction, and a connection portion 230L connected to a bottom of the active pillar 230A1 and a bottom of the second active pillar 230A2. A first source/drain region SD1 may be disposed in the connection portion 230L, and a second source/drain region SD2 may be disposed at an upper portion of the first and second active pillars 230A1 and 230A2. An independent unit memory cell may be formed on each of the first active pillar 230A1 and the second active pillar 230A2.

The plurality of first conductive lines 220A may extend to be cross each of the plurality of active regions AC. For example, each of the first conductive lines 220A may extend in the second direction (Y direction). One of the plurality of first conductive lines 220A may be disposed on the connection portion 230L between the first active pillar 230A1 and the second active pillar 230A2, and the one of the first conductive line 220A may be disposed on the first source/drain region SD1. Another first conductive line 220A adjacent to the one of first conductive line 220A may be disposed between the two channel structures 230A. Each of the first conductive lines 220A may serve as a common bit line of two unit memory cells formed at adjacent the first active pillar 230A1 and the second active pillar 230A2

One contact gate electrode 240A may be disposed between the two adjacent channel structures 230A in the second direction (Y direction). For example, a contact gate electrode 240A may be disposed between the first active pillar 230A1 in the channel structure 230A and the second active pillar 230A2 in the other channel structure 230A adjacent thereto. The first active pillar 230A1 and the second active pillar 230A2 disposed on both sidewalls of one contact gate electrode 240A may use the one contact gate electrode by sharing with each other.

A gate insulation layer 250A and an impurity barrier layer 252A may be disposed between the contact gate electrode 240A and the first active pillar 230A1 and between the contact gate electrode 240A and the second active pillar 230A2. The gate insulation layer 250A may be formed on surfaces of the first and second active pillars, and an impurity barrier layer 252A may be formed on the gate insulation layer 250A. The impurity barrier layer 252A may include a material of the gate insulation layer 250A and further nitrogen. The impurity barrier layer 252A may prevent or reduce the likelihood of impurities including reactive gases and/or reactants from diffusing and/or penetrating into the gate insulation layer 250A, during subsequent thermal processes.

The plurality of second conductive lines 242A may be formed on an upper surface of the contact gate electrode 240A so as to extend in the first direction (X direction). The plurality of second conductive lines 242A may serve as word lines of the semiconductor device 200A.

A capacitor contact 260A may be disposed on the channel structure 230A. The capacitor contact 260A may be disposed on the second source/drain region SD2, and the capacitor structure 280 may be disposed on the capacitor contact 260A.

Transistors in accordance with some example embodiments may serve as switching devices included in logic devices, flash memory devices, magnetoresistive memory devices, and phase change memory devices.

The foregoing is illustrative of some example embodiments and is not to be construed as limiting thereof. Although a few example embodiments have been described, those of ordinary skill in the art will readily appreciate that many modifications are possible in the example embodiments without materially departing from the novel teachings and advantages of the present inventive concept. Accordingly, all such example modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of some various example embodiments and is not to be construed as limited to the specific example embodiments disclosed, and that modifications to the disclosed example embodiments, as well as other example embodiments, are intended to be included within the scope of the appended claims. Still further none of the disclosed example embodiments are necessarily mutually exclusive with one another. For example, some example embodiments may include features described with reference to one figure, and may also include features described with reference to another figure.

What is claimed is:

1. A semiconductor device, comprising:
a substrate having a recess;
a gate insulation layer on a surface of the recess;
an impurity barrier layer on a surface of the gate insulation layer, the impurity barrier layer covering the surface of the gate insulation layer, the impurity barrier layer having a concentration of nitrogen greater than a concentration of nitrogen included in the gate insulation layer;
a first gate pattern on the impurity barrier layer, the first gate pattern filling a lower portion of the recess;
a second gate pattern on the first gate pattern and in the recess, the second gate pattern including a material different from materials included in the first gate pattern;
a capping insulation pattern on the second gate pattern, the capping insulation pattern filling the recess, the impurity barrier layer extending between the capping insulation pattern and the gate insulation layer; and
impurity regions at the substrate adjacent to an upper sidewall of the recess.

2. The semiconductor device of claim 1, wherein the impurity barrier layer includes a material of the gate insulation layer that is not nitrogen, and further includes nitrogen.

3. The semiconductor device of claim 1, wherein the impurity barrier layer includes a first impurity barrier layer covering a surface of the gate insulation layer at a lower portion of the recess, and a second impurity barrier layer covering a surface of the gate insulation layer at an upper portion of the recess.

4. The semiconductor device of claim 3, wherein a concentration of nitrogen included in the second impurity barrier layer is higher than a concentration of nitrogen included in the first impurity barrier layer.

5. The semiconductor device of claim 3, further comprising:
a barrier interface layer pattern on an upper surface of the first gate pattern.

6. The semiconductor device of claim 5, wherein at an upper surface of the first gate pattern, the barrier interface layer pattern includes at least one of nitride or oxynitride.

7. The semiconductor device of claim 6, wherein the first impurity barrier layer is on the gate insulation layer positioned lower than an upper surface of the barrier interface layer pattern, and the second impurity barrier layer is on the gate insulation layer positioned higher than the upper surface of the barrier interface layer pattern.

8. The semiconductor device of claim 7, further comprising:
an upper barrier interface layer pattern on the barrier interface layer pattern, the upper barrier interface layer pattern having a concentration of nitrogen higher than a concentration of nitrogen included in the barrier interface layer pattern.

9. The semiconductor device of claim 3, wherein the first impurity barrier layer is on the gate insulation layer lower than an upper surface of the second gate pattern, and the second impurity barrier layer is on the gate insulation layer higher than an upper surface of the second gate pattern.

10. The semiconductor device of claim 9, further comprising:
an upper barrier interface layer pattern on the second gate pattern, the upper barrier interface layer pattern having a concentration of nitrogen greater than a concentration of nitrogen included in the second gate pattern.

11. The semiconductor device of claim 1, wherein the first gate pattern includes,
a barrier metal pattern contacting the impurity barrier layer, and
a metal pattern on the barrier metal pattern.

12. The semiconductor device of claim 1, wherein work functions of the first and second gate patterns are different from each other, and
a difference between the work function of the second gate pattern and a work function of at least one of the impurity regions is less than a difference between the work function of the first gate pattern and the work function of the at least one of the impurity regions.

13. The semiconductor device of claim 1, wherein the second gate pattern includes doped polysilicon.

14. A semiconductor device, comprising:
a substrate having a recess;
a gate insulation layer on a surface of the recess;
a first impurity barrier layer covering a surface of the gate insulation layer at a lower portion of the recess, the first impurity barrier layer having a concentration of nitrogen greater than a concentration of nitrogen included in the gate insulation layer;
a second impurity barrier layer covering a surface of the gate insulation layer at an upper portion of the recess, the second impurity barrier layer having a concentration of nitrogen greater than a concentration of nitrogen included in the first impurity barrier layer;
a first gate pattern on the gate insulation layer and filling a lower portion of the recess, the first gate pattern including a metal;
a second gate pattern on the first gate pattern and in the recess, the second gate pattern including doped polysilicon;
a capping insulation pattern filling the recess; and
impurity regions at the substrate adjacent to an upper sidewall of the recess, lower surfaces of the impurity regions being higher than an upper surface of the first gate pattern.

15. The semiconductor device of claim 14, wherein the first and second impurity barrier layers include a material of the gate insulation layer that is not nitrogen and further includes nitrogen.

16. The semiconductor device of claim 14, further comprising:
a barrier interface layer pattern on an upper surface of the first gate pattern.

17. The semiconductor device of claim 16, wherein the first impurity barrier layer is on the gate insulation layer lower than an upper surface of the barrier interface layer pattern, and the second impurity barrier layer is on the gate insulation layer higher than the upper surface of the barrier interface layer pattern.

18. The semiconductor device of claim 14, wherein the first impurity barrier layer is on the gate insulation layer lower than an upper surface of the second gate pattern, and the second impurity barrier layer is on the gate insulation layer higher than an upper surface of the second gate pattern.

19. A semiconductor device, comprising:
   a substrate including an isolation region and an active region, the substrate defining a recess extending in a first direction;
   a gate insulation layer on a surface of the recess;
   an impurity barrier layer on a surface of the gate insulation layer, the impurity barrier layer covering the surface of the gate insulation layer, the impurity barrier layer having a concentration of nitrogen greater than a concentration of nitrogen of the gate insulation layer;
   a first gate pattern on the impurity barrier layer filling a lower portion of the recess;
   a barrier interface layer pattern on an upper surface of the first gate pattern having a chemical composition different from the impurity barrier layer;
   a second gate pattern on the first gate pattern in the recess and the second gate pattern including a material having a work function different from a work function of the first gate pattern;
   a capping insulation pattern on the second gate pattern, the capping insulation pattern filling the recess;
   first and second impurity regions at the substrate adjacent to an upper sidewall of the recess, lower surfaces of the first and second impurity regions being higher than an upper surface of the first gate pattern;
   a bit line structure electrically connected to the first impurity region; and
   a capacitor electrically connected to the second impurity region.

20. The semiconductor device of claim 19, wherein a difference between a work function of the second gate pattern and a work function of the first impurity region and the second impurity region is less than a difference between a work function of the first gate pattern and the work function of the first impurity region and the second impurity region.

* * * * *